United States Patent
Ito et al.

(10) Patent No.: US 10,685,983 B2
(45) Date of Patent: Jun. 16, 2020

(54) TRANSISTOR, SEMICONDUCTOR DEVICE, AND ELECTRONIC DEVICE

(71) Applicant: Semiconductor Energy Laboratory Co., Ltd., Atsugi-shi, Kanagawa-ken (JP)

(72) Inventors: Daigo Ito, Isehara (JP); Yutaka Okazaki, Isehara (JP); Takahisa Ishiyama, Atsugi (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 113 days.

(21) Appl. No.: 15/794,464

(22) Filed: Oct. 26, 2017

(65) Prior Publication Data

US 2018/0138208 A1    May 17, 2018

(30) Foreign Application Priority Data

Nov. 11, 2016  (JP) ................. 2016-220496

(51) Int. Cl.
| | | |
|---|---|---|
| *H01L 27/12* | (2006.01) | |
| *H01L 27/115* | (2017.01) | |
| *H01L 29/786* | (2006.01) | |
| *H01L 27/11556* | (2017.01) | |

(52) U.S. Cl.
CPC ........ *H01L 27/1207* (2013.01); *H01L 27/115* (2013.01); *H01L 27/1225* (2013.01); *H01L 27/1251* (2013.01); *H01L 27/1255* (2013.01); *H01L 29/7869* (2013.01); *H01L 27/11556* (2013.01); *H01L 29/78648* (2013.01)

(58) Field of Classification Search
None
See application file for complete search history.

(56) References Cited

U.S. PATENT DOCUMENTS

| | | | |
|---|---|---|---|
| 5,299,155 A * | 3/1994 | Yanagi | ......... H01L 27/108 257/306 |
| 7,737,478 B2 | 6/2010 | Yanagisawa et al. | |
| 7,923,733 B2 | 4/2011 | Kamata | |
| 8,199,551 B2 | 6/2012 | Matsuzaki | |
| 8,258,862 B2 | 9/2012 | Matsuzaki et al. | |
| 8,319,528 B2 | 11/2012 | Kimura et al. | |
| 8,384,080 B2 | 2/2013 | Taniguchi et al. | |
| 8,431,883 B2 | 4/2013 | Yanagisawa et al. | |
| 8,507,907 B2 | 8/2013 | Takahashi et al. | |
| 8,540,161 B2 | 9/2013 | Shionoiri et al. | |
| 8,547,771 B2 | 10/2013 | Koyama | |

(Continued)

FOREIGN PATENT DOCUMENTS

| | | |
|---|---|---|
| JP | 2011-124360 | 6/2011 |
| JP | 2011-138934 | 7/2011 |
| JP | 2012-257187 | 12/2012 |

*Primary Examiner* — Hoang-Quan Ho
(74) *Attorney, Agent, or Firm* — Robinson Intellectual Property Law Office; Eric J. Robinson

(57) ABSTRACT

To provide a semiconductor device capable of retaining data for a long time. The semiconductor device includes a first transistor, an insulator covering the first transistor, and a second transistor over the insulator. The first transistor includes a first gate electrode, a second gate electrode overlapping with the first gate electrode, and a semiconductor between the first gate electrode and the second gate electrode. The first gate electrode is electrically connected to one of a source and a drain of the second transistor.

12 Claims, 19 Drawing Sheets

(56) References Cited

U.S. PATENT DOCUMENTS

| | | |
|---|---|---|
| 8,614,910 B2 | 12/2013 | Shionoiri |
| 8,692,252 B2 | 4/2014 | Takata et al. |
| 8,716,646 B2 | 5/2014 | Hirose |
| 8,737,109 B2 | 5/2014 | Yamazaki et al. |
| 8,749,930 B2 | 6/2014 | Shishido et al. |
| 8,941,958 B2 | 1/2015 | Tomatsu |
| 8,947,158 B2 | 2/2015 | Watanabe |
| 8,948,696 B2 | 2/2015 | Yamashita et al. |
| 9,024,317 B2 | 5/2015 | Endo et al. |
| 9,048,320 B2 | 6/2015 | Yamazaki et al. |
| 9,048,356 B2 | 6/2015 | Asami |
| 9,105,609 B2 | 8/2015 | Yamazaki |
| 9,209,209 B2 | 12/2015 | Hirose |
| 9,312,280 B2 | 4/2016 | Kobayashi |
| 9,318,484 B2 | 4/2016 | Matsubayashi |
| 9,337,826 B2 | 5/2016 | Koyama et al. |
| 9,667,148 B2 | 5/2017 | Kimura et al. |
| 9,673,335 B2 | 6/2017 | Kamata |
| 10,014,068 B2 * | 7/2018 | Sakakura ............ H01L 27/124 |
| 2011/0147737 A1 | 6/2011 | Yamazaki et al. |
| 2011/0156025 A1 * | 6/2011 | Shionoiri ............ H01L 27/124 257/43 |
| 2013/0193493 A1 | 8/2013 | Yamazaki |
| 2014/0231799 A1 * | 8/2014 | Matsubayashi ..... H01L 27/0629 257/43 |
| 2015/0054571 A1 | 2/2015 | Watanabe et al. |
| 2015/0348961 A1 | 12/2015 | Isobe |
| 2016/0284823 A1 | 9/2016 | Yamazaki |
| 2017/0005659 A1 | 1/2017 | Tamura |
| 2017/0062433 A1 | 3/2017 | Miyairi et al. |
| 2017/0179294 A1 | 6/2017 | Kato et al. |
| 2017/0186473 A1 | 6/2017 | Ikeda et al. |
| 2017/0186749 A1 | 6/2017 | Ohshima et al. |
| 2017/0207244 A1 | 7/2017 | Kato |
| 2017/0229486 A1 | 8/2017 | Matsuda et al. |
| 2017/0236842 A1 | 8/2017 | Matsuda et al. |
| 2017/0263650 A1 | 9/2017 | Tochibayashi et al. |
| 2017/0263651 A1 | 9/2017 | Tochibayashi et al. |
| 2017/0271516 A1 | 9/2017 | Onuki et al. |
| 2017/0278973 A1 | 9/2017 | Ando |

* cited by examiner

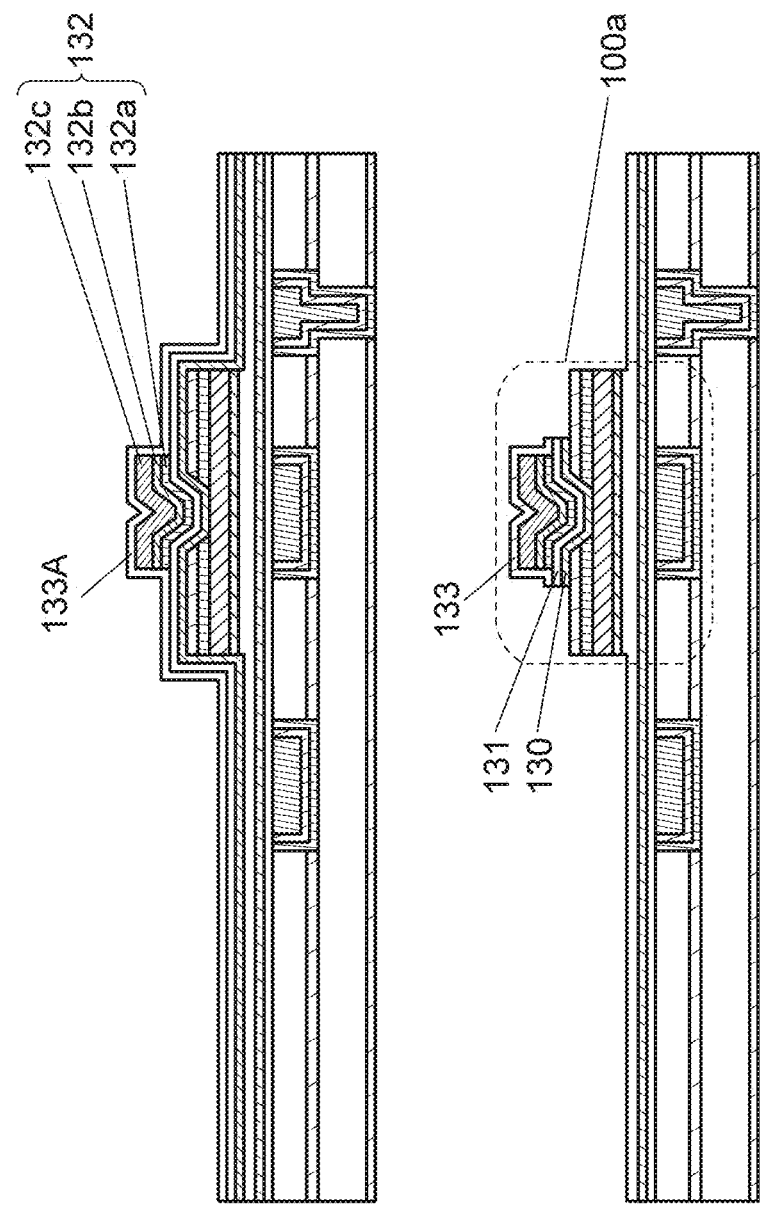

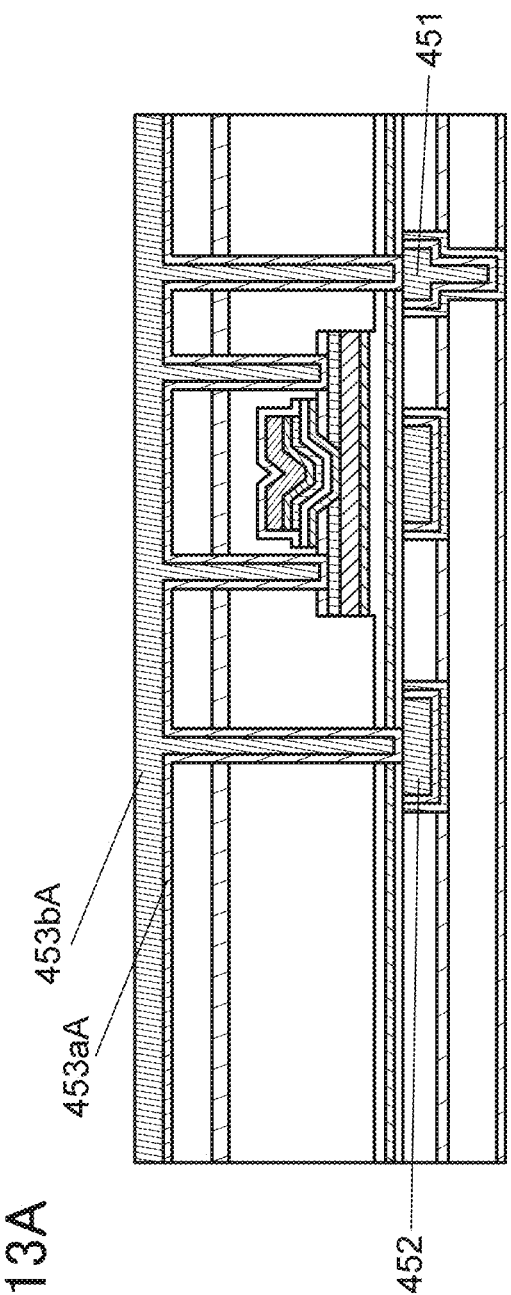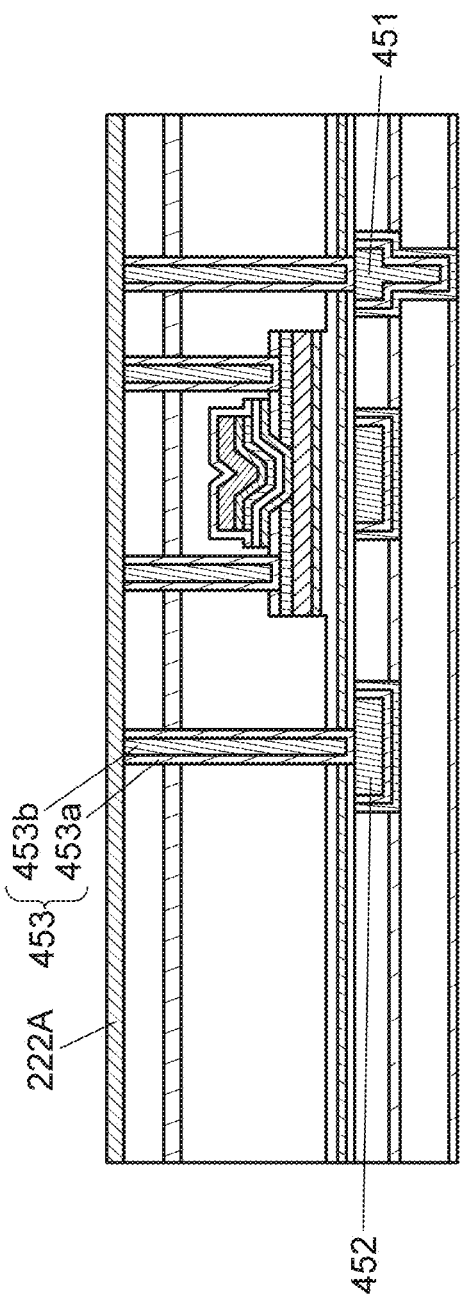

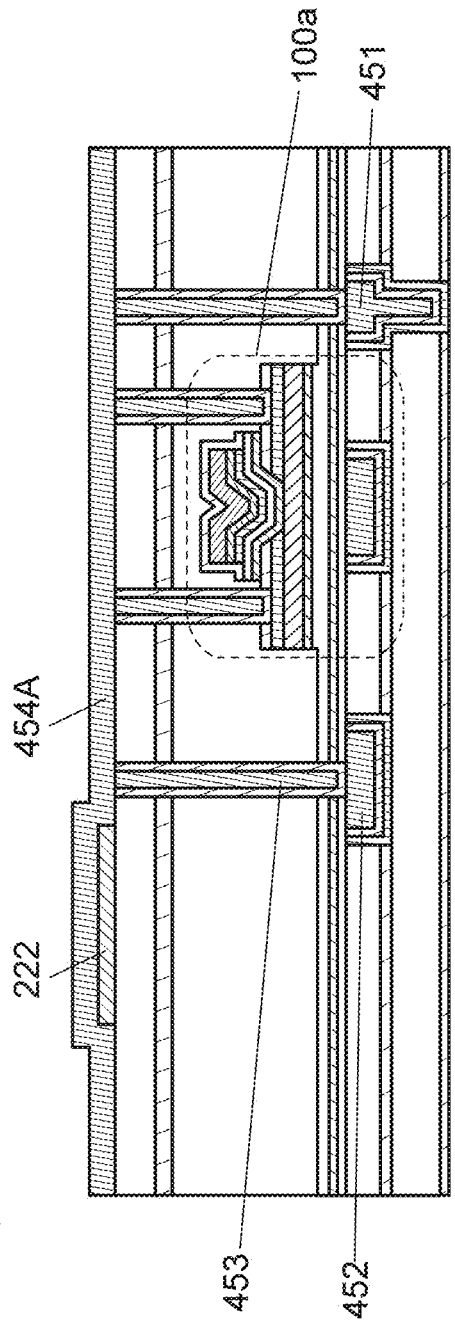
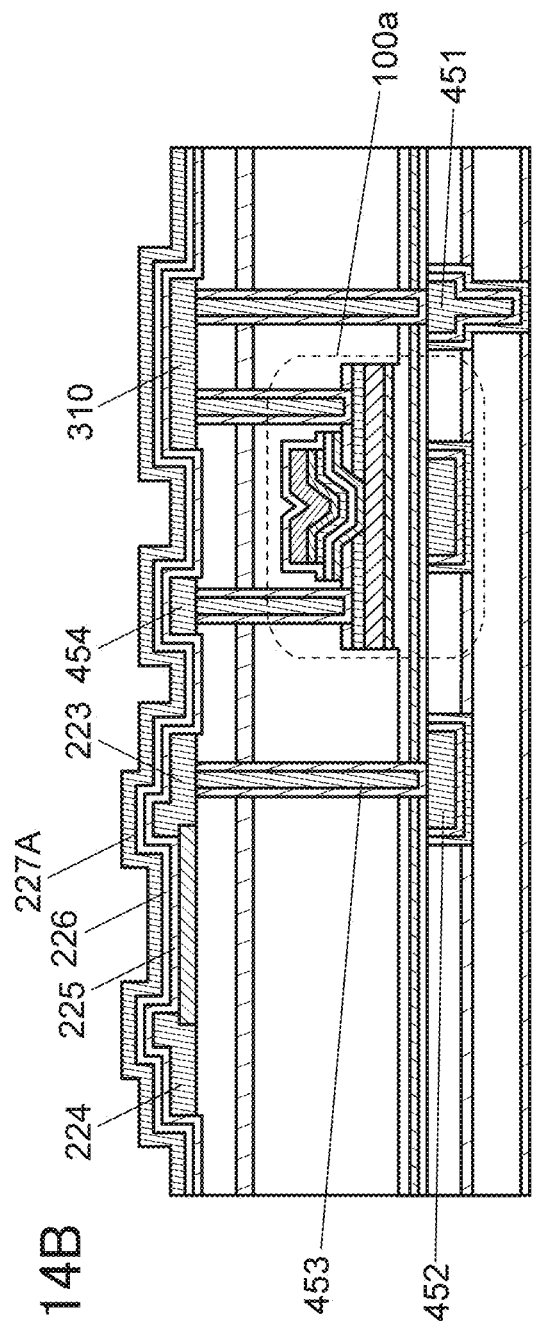
FIG. 14A
FIG. 14B

TRANSISTOR, SEMICONDUCTOR DEVICE, AND ELECTRONIC DEVICE

BACKGROUND OF THE INVENTION

1. Field of the Invention

The present invention relates to an object, a method, or a manufacturing method. The present invention relates to a process, a machine, manufacture, or a composition of matter. One embodiment of the present invention relates to a semiconductor device, a light-emitting device, a display device, an electronic device, a lighting device, and a manufacturing method thereof. In particular, one embodiment of the present invention relates to a light-emitting device using an organic electroluminescence (hereinafter also referred to as EL) phenomenon, and a method for fabricating the light-emitting device. For example, one embodiment of the present invention relates to an electronic device that includes, as a component, an LSI, a CPU, a power device mounted in a power circuit, or a semiconductor integrated circuit including a memory, a thyristor, a converter, an image sensor, or the like.

Note that one embodiment of the present invention is not limited to the above technical field.

In this specification, a semiconductor device generally means a device that can function by utilizing semiconductor characteristics. An electro-optical device, a semiconductor circuit, and an electronic device include a semiconductor device in some cases.

2. Description of the Related Art

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) and an image display device (also simply referred to as a display device). A silicon-based semiconductor material is widely known as a material for a semiconductor thin film that can be used for a transistor. As another material, an oxide semiconductor has been attracting attention.

It is known that a transistor including an oxide semiconductor has an extremely small leakage current in an off state. For example, a low-power-consumption CPU utilizing a characteristic of small leakage current of the transistor including an oxide semiconductor is disclosed (see Patent Document 1).

In addition, a technique in which oxide semiconductor layers with different electron affinities (or conduction band minimum states) are stacked to increase the carrier mobility of a transistor is disclosed (see Patent Documents 2 and 3).

In recent years, demand for an integrated circuit in which transistors and the like are integrated with high density has risen with reductions in the size and weight of an electronic device. In addition, the productivity of a semiconductor device including an integrated circuit is required to be improved.

REFERENCE

Patent Document

[Patent Document 1] Japanese Published Patent Application No. 2012-257187
[Patent Document 2] Japanese Published Patent Application No. 2011-124360
[Patent Document 3] Japanese Published Patent Application No. 2011-138934

SUMMARY OF THE INVENTION

An object of one embodiment of the present invention is to provide a semiconductor device having favorable electrical characteristics. Another object of one embodiment of the present invention is to provide a semiconductor device that can be miniaturized or highly integrated. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a low-power semiconductor device. Another object of one embodiment of the present invention is to provide a novel semiconductor device.

Note that the description of these objects does not disturb the existence of other objects. In one embodiment of the present invention, there is no need to achieve all the objects. Other objects will be apparent from and can be derived from the description of the specification, the drawings, the claims, and the like.

A first transistor and a second transistor that has electrical characteristics different from those of the first transistor and is over an insulator covering the first transistor are provided. For example, the first transistor having a first threshold voltage and the second transistor having a second threshold voltage are provided. A semiconductor layer where a channel of the first transistor is formed and a semiconductor layer where a channel of the second transistor is formed are formed using semiconductor materials having different electron affinities. The first transistor having higher carrier mobility and a larger on-state current than the second transistor and the second transistor having a smaller drain current at a gate voltage of 0 V than the first transistor are provided.

Furthermore, the first transistor, and a second transistor having electrical characteristics different from those of the first transistor and a capacitor that are over an insulator covering the first transistor are provided. The second transistor and the capacitor are provided in the same layer.

Providing transistors having different electrical characteristics in one semiconductor device can increase circuit design flexibility. In the case where transistors having different electrical characteristics and a capacitor are provided in one semiconductor device, however, the number of manufacturing steps of the semiconductor device might be drastically increased. The drastic increase in the number of manufacturing steps easily leads to a decrease in yield, and the productivity of the semiconductor device is significantly decreased in some cases. According to one embodiment of the present invention, some manufacturing steps are used in common for a transistor and a capacitor, whereby transistors having different electrical characteristics and a capacitor can be provided in one semiconductor device without a drastic increase in the number of the manufacturing steps of the semiconductor device.

One embodiment of the present invention is a semiconductor device including a first transistor, an insulator covering the first transistor, and a second transistor over the insulator. The first transistor includes a first gate electrode, a second gate electrode overlapping with the first gate electrode, and a semiconductor between the first gate electrode and the second gate electrode. The first gate electrode is electrically connected to one of a source and a drain of the second transistor and a third gate electrode of the second transistor.

In the semiconductor device, it is preferred that the semiconductor be a first semiconductor, the second transistor include a second semiconductor and first and second electrodes electrically connected to the second semiconductor, and the first gate electrode and the one of the source and the drain of the second transistor be electrically connected to each other through one of the first electrode and the second electrode.

In the semiconductor device, it is preferred that the insulator be a first insulator, a capacitor be located over the first insulator, the capacitor include a third electrode, a fourth electrode, and a second insulator between the third electrode and the fourth electrode, the third electrode be electrically connected to one of a source and a drain of the first transistor, the third electrode be formed with the same material as the first electrode and the second electrode, the fourth electrode be formed with the same material as the third gate electrode, and the second insulator be formed with the same material as a gate insulating film included in the second transistor.

In the semiconductor device, the carrier mobility of the first transistor is preferably higher than the carrier mobility of the second transistor.

In the semiconductor device, the drain current of the second transistor when a gate voltage applied to the second transistor is 0 V is preferably smaller than the drain current of the first transistor when a gate voltage applied to the first transistor is 0 V.

A change in electric characteristics can be prevented and reliability can be improved in a semiconductor device using a transistor including an oxide semiconductor. A transistor including an oxide semiconductor with a large on-state current can be provided. A transistor including an oxide semiconductor with a small off-state current can be provided. A semiconductor device with low power consumption can be provided.

A novel semiconductor device can be provided. A module including the semiconductor device can be provided. An electronic device including the semiconductor device or the module can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF THE DRAWINGS

FIGS. 11A and 11B illustrate a method for manufacturing a transistor of one embodiment of the present invention.

FIGS. 13A and 13B illustrate a method for manufacturing a transistor of one embodiment of the present invention.

FIGS. 14A and 14B illustrate a method for manufacturing a transistor of one embodiment of the present invention.

DETAILED DESCRIPTION OF THE INVENTION

Figure 1A:
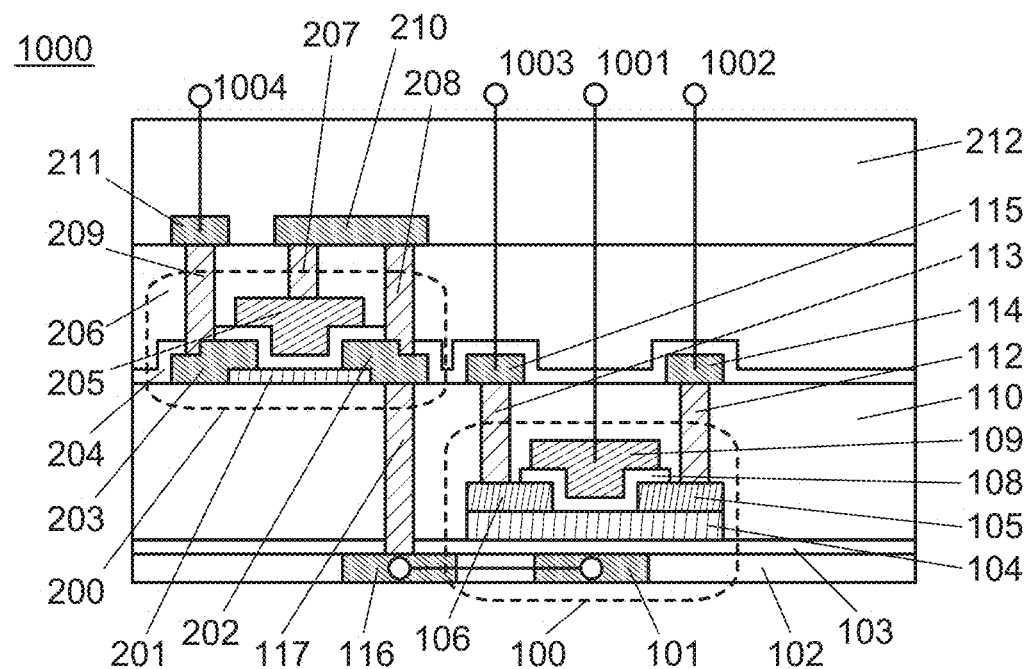
FIGS. 1A and 1B are a cross-sectional view and a circuit diagram of a semiconductor device of one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to the shapes or values shown in the drawings. In the drawings, the same portions or portions having similar functions are denoted by the same reference numerals in different drawings, and explanation thereof will not be repeated. In addition, the same hatching pattern is applied to portions having similar functions, and the portions are not particularly denoted by reference numerals in some cases.

Note that the ordinal numbers such as "first" and "second" in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relation between components is changed as appropriate in accordance with the direction in which each component is described. Thus, there is no limitation on terms used in this specification, and description can be made appropriately depending on the situation.

The "semiconductor device" in this specification and the like means every device which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. The transistor has a channel formation region between a drain (a drain terminal, a drain region, or a drain electrode) and a source (a source terminal, a source region, or a source electrode), and current can flow between the source and the drain via the channel formation region. Note that in this specification and the like, a channel region refers to a region through which current mainly flows.

Furthermore, the functions of a source and a drain might be interchanged with each other when transistors having different polarities are employed or the direction of current flow is changed in circuit operation, for example. Therefore, the terms "source" and "drain" can be interchanged with each other in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentration ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

Furthermore, unless otherwise specified, a transistor described in this specification and the like refers to an enhancement (normally-off) field effect transistors. Unless otherwise specified, a transistor described in this specification and the like refers to an n-channel transistor. Thus, unless otherwise specified, the threshold voltage (also referred to as "Vth") is larger than 0 V.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

In this specification, trigonal and rhombohedral crystal systems are included in a hexagonal crystal system.

For example, in this specification and the like, an explicit description "X and Y are connected" means that X and Y are electrically connected, X and Y are functionally connected, and X and Y are directly connected. Accordingly, without being limited to a predetermined connection relation, for example, the connection relation shown in drawings or texts, another connection relation is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is turned on or off to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit and a step-down circuit) and a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; and a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification, a barrier film refers to a film having a function of inhibiting the passage of oxygen and impurities such as hydrogen. The barrier film that has conductivity may be referred to as a conductive barrier film.

Embodiment 1

Providing transistors having different electrical characteristics in a semiconductor device can increase the degree of freedom in design of the semiconductor device. Furthermore, providing transistors having different electrical characteristics in different layers can increase the degree of integration in the semiconductor device. Specifically, transistors having different compositions of semiconductor materials and including semiconductors with different thicknesses are provided in a semiconductor device so that one of the transistors has higher carrier mobility and a larger on-state current and the other has a smaller drain current at a gate voltage of 0 V. As a transistor required to have a high operation frequency, such as a switching transistor, a transistor with higher carrier mobility and a larger on-state current is used. As a transistor for storing charge in a capacitor or an electrode, such as a storage transistor, a transistor with a smaller drain current at a gate voltage of 0 V is used. As will be described later in this embodiment, a semiconductor device composed of such transistors can have a variety of functions. In this embodiment, an example of an embodiment where transistors having different electrical characteristics are provided in different layers will be described.

<Structure Example of Semiconductor Device 1000>

Figure 1B:
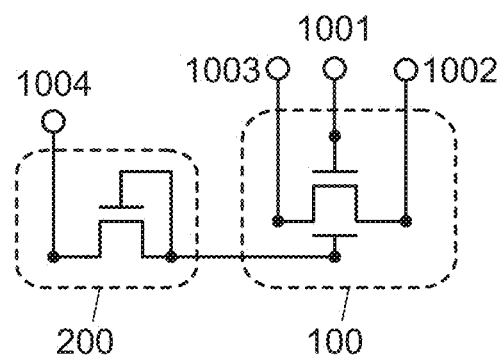

FIG. 1A is a cross-sectional view of a semiconductor device 1000, and FIG. 1B is a circuit diagram of the semiconductor device 1000. The semiconductor device 1000 includes transistors 100 and 200. The transistors 100 and 200 have different structures. The transistor 200 is provided over an insulator 110 provided to cover the transistor 100.

In FIG. 1A, the transistor 100 is provided over an insulator substrate, a semiconductor substrate, or a substrate having an insulating surface, and includes a conductor 101, an insulator 103, a semiconductor 104, a conductor 105, a conductor 106, an insulator 108, and a conductor 109. The conductor 101 is formed to be embedded in the insulator 102. The conductor 101 functions as a first gate electrode of the transistor 100. At least part of the semiconductor 104 overlaps with at least part of the conductor 101. The insulator 103 provided between the conductor 101 and the semiconductor 104 can function as a first gate insulating film. The conductor 105 functions as one of a source electrode and a drain electrode and is electrically connected to the semiconductor 104. The conductor 106 functions as the other of the source electrode and the drain electrode and is electrically connected to the semiconductor 104. In the case where regions that function as source and drain regions are provided in the semiconductor 104, the conductor 105 and the conductor 106 are not necessarily provided. The conductor 109 functions as a second gate electrode. The insulator 108 is provided between the semiconductor 104 and the conductor 109 and functions as a second gate insulating film. The insulator 108 may be provided to cover the entire semiconductor 104 or to cover the semiconductor 104 and the insulator 103 as long as the insulator 108 is provided in a portion where at least the conductor 109 and the semiconductor 104 overlap with each other.

The transistor 100 is covered with the insulator 110. A conductor 112 and a conductor 113 are provided to be embedded in the insulator 110. The conductor 112 is electrically connected to the semiconductor 104 through the conductor 105, and the conductor 113 is electrically connected to the semiconductor 104 through the conductor 106. Conductors 114 and 115 are provided over the insulator 110. The conductor 114 is electrically connected to the conductor 112, and the conductor 115 is electrically connected to the conductor 113.

A conductor 117 is provided to be embedded in the insulators 103 and 110 and is electrically connected to a conductor 116. The conductor 116 is provided in the same layer as the conductor 101 and may be electrically connected to the conductor 101. The conductors 101 and 116 may be a single component.

The transistor 200 is provided over the insulator 110. The transistor 200 includes a semiconductor 201, a conductor 202, a conductor 203, an insulator 204, and a conductor 205, which are over the insulator 110. The semiconductor 201 has a property different from that of the semiconductor 104. Specifically, a material, the content ratio of elements, and the thickness of the semiconductor 201 are different from those of the semiconductor 104. Alternatively, semiconductors may include channel formation regions with different widths or lengths so as to have different properties. The conductor 202 functions as one of a source electrode and a drain electrode of the transistor 200 and is electrically connected to the conductor 117. The conductor 203 functions as the other of the source electrode and the drain electrode. The insulator 204 is provided to cover the semiconductor 201, the conductor 202, and the conductor 203. Furthermore, the insulator 204 can be provided to also cover the conductors 114 and 115. The conductor 205 is provided over the insulator 204 such that at least part of the conductor 205 overlaps with at least part of the semiconductor 201. The conductor 205 functions as a gate electrode of the transistor 200.

The transistor 200 is covered with the insulator 206. Conductors 207, 208, and 209 are provided to be embedded in the insulator 206. The conductor 207 is electrically connected to the conductor 205, the conductor 208 is electrically connected to the conductor 202, and the conductor 209 is electrically connected to the conductor 203. Conductors 210 and 211 are provided over the insulator 206. The conductor 210 is electrically connected to the conductors 207 and 208, and the conductor 211 is electrically connected to the conductor 209. The insulator 212 can be provided to cover the conductors 210 and 211.

That is, in this embodiment, the first gate of the transistor 100, the gate of the transistor 200, and the one of the source and the drain of the transistor 200 are electrically connected through the conductors 116, 117, 202, 208, 210, and 207 and the like. The conductors 109, 114, 115, and 211 are electrically connected to terminals 1001, 1002, 1003, and 1004, respectively.

Electrically connecting the transistors 100 and 200 as in FIGS. 1A and 1B allows the potential of the terminal 1004 to be supplied to the conductor 101 so as to be held. By supplying a desired potential to the conductor 101 functioning as the first gate electrode, the threshold value of the transistor 100 is controlled, and the semiconductor device 1000 can have favorable characteristics. In particular, the use of a transistor with higher carrier mobility and a larger on-state current as the transistor 100 enables the semiconductor device 1000 to operate at high speed. Furthermore, the use of a transistor with a smaller drain current at a gate voltage of 0 V as the transistor 200 enables charge of the conductor 101 to be stored for a long period of time with lower power consumption.

However, the connection relation between the transistor 100 and 200 is not limited to this embodiment. The connection relation can be changed depending on a required circuit configuration.

<Structure Example of Semiconductor Device 1000a>

Figure 2A:
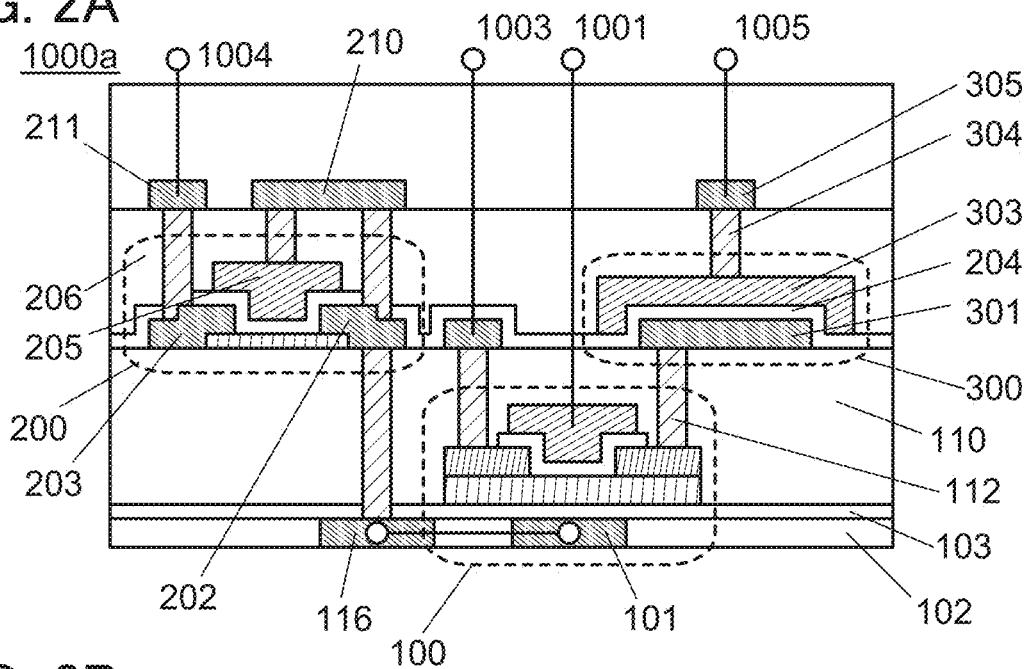
FIGS. 2A to 2D are a cross-sectional view and circuit diagrams of semiconductor devices of embodiments of the present invention.
Figure 2B:
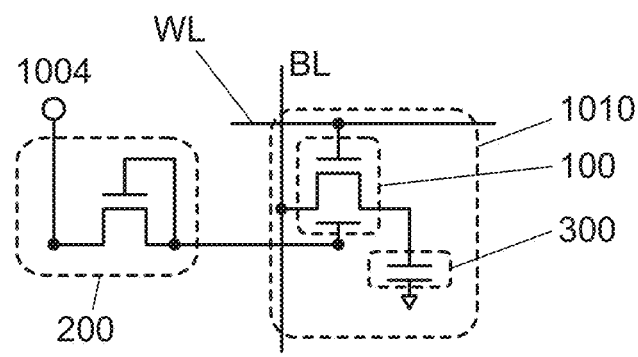
Figures 2C, 2D:
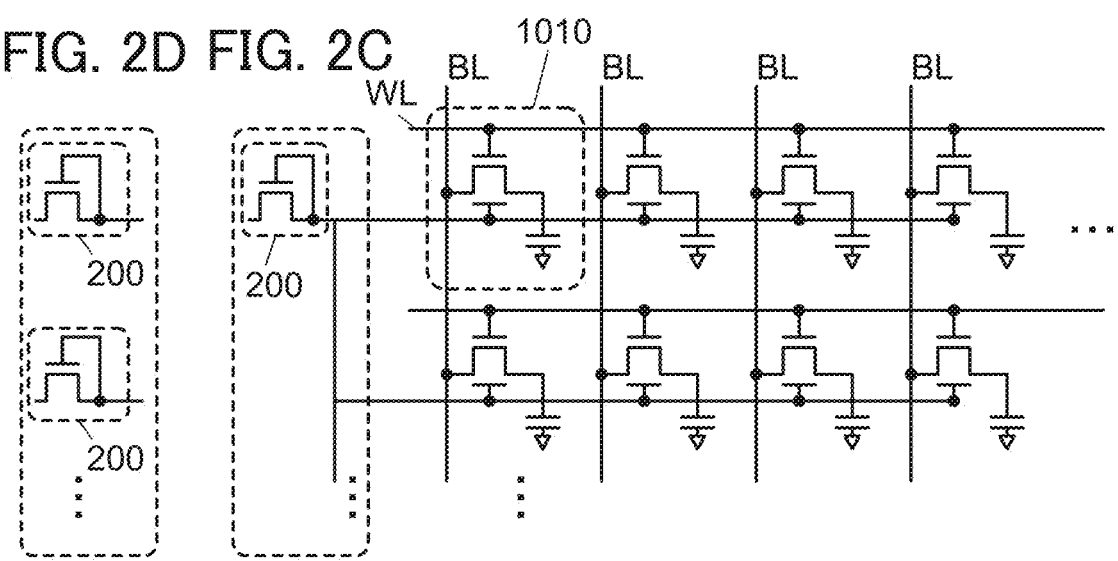

FIG. 2A is a cross-sectional view of a semiconductor device 1000a, FIG. 2B is a circuit diagram of the semiconductor device 1000a, and FIG. 2C is a circuit diagram illustrating an application example using the semiconductor device 1000a. The semiconductor device 1000a includes the transistor 100, the transistor 200, and a capacitor 300. The transistors 100 and 200 have different structures. The transistor 200 and the capacitor 300 are provided in the same layer over the insulator 110 provided to cover the transistor 100.

In FIG. 2A, the transistors 100 and 200 in the semiconductor device 1000 that are described above can be used as the transistors 100 and 200; thus, the description thereof is not repeated. The capacitor 300 includes a conductor 301, an insulator 204, and a conductor 303. The conductor 301 functions as a first electrode (lower electrode), and the conductor 303 functions as a second electrode (upper electrode). The insulator 204 functions as a dielectric.

The conductor 301 is formed with the same material at the same time as the conductors 202 and 203 and the like of the transistor 200. The insulator 204 is formed in the same layer as a gate insulating film of the transistor 200. The conductor 303 is formed with the same material at the same time as the conductor 205 of the transistor 200. In addition, conductors 304 and 305 electrically connected to the conductor 303 can be provided. The conductor 304 is provided to be embedded in the insulator 206 provided to cover the transistor 200 and the capacitor 300. The conductor 305 is provided over the insulator 206.

The conductor 301 is electrically connected to the one of the source and the drain of the transistor 100 through the conductor 112 provided to be embedded in the insulator 110.

In FIG. 2A, the first gate of the transistor 100, the gate of the transistor 200, and the one of the source and the drain of the transistor 200 are electrically connected through the conductors 116, 117, 202, 208, 210, and 207 and the like. The conductor 109 functioning as the second gate electrode of the transistor 100 is electrically connected to the terminal 1001. The one of the source and the drain of the transistor 100 is electrically connected to the first electrode of the capacitor 300. The other of the source and the drain of the transistor 100 is electrically connected to the terminal 1003. The other of the source and the drain of the transistor 200 is electrically connected to the terminal 1004. The second electrode of the capacitor 300 is electrically connected to a terminal 1005.

Electrically connecting the transistors 100 and 200 and the capacitor 300 as in FIG. 2A allows the semiconductor device 1000a to constitute a memory element (memory cell).

FIG. 2B is a circuit diagram corresponding to FIG. 2A and illustrates a configuration where a memory cell 1010 includes the transistor 100 and the capacitor 300 and the transistor 200 is electrically connected to the first gate of the transistor 100. The terminals 1001 and 1003 in FIG. 2A are electrically connected to a word line (WL) and a bit line (BL) in FIG. 2B, respectively. A ground potential or a given potential is supplied to the terminal 1005.

When the transistor 100 is turned on by a signal of the WL, the potential of the BL can be supplied to the first electrode of the capacitor 300. After that, the transistor 100 is turned off by a signal of the WL, whereby charge can be stored in the capacitor 300. In this manner, data can be written.

When data is read, the transistor 100 is turned on by the signal of the WL so that the amount of charge stored in the capacitor 300 is read by a read circuit connected to the BL.

The use of a transistor with higher carrier mobility and a larger on-state current as the transistor 100 enables data writing and data reading to and from the memory cell 1010 in the semiconductor device 1000a to be performed at higher speed. Furthermore, the transistor 200 is connected to the conductor 101 functioning as the first gate of the transistor 100, whereby the threshold value of the transistor 100 is controlled, and data can be held in the memory cell 1010 for a long period of time. That is, by turning on the transistor 200 to supply the potential of the terminal 1004 to the conductor 101, a negative charge can be supplied to the conductor 101, and the threshold value of the transistor 100 can be shifted to the positive direction. Shifting the threshold value of the transistor 100 to the positive direction further decreases a drain current when the gate voltage of the transistor 100 is 0 V, so that data can be held in the memory cell 1010 for a long period of time. In particular, the use of a transistor with a smaller drain current at a gate voltage of 0 V as the transistor 200 enables charge supplied to the conductor 101 to be stored for a long period of time with lower power consumption.

FIG. 2C is a circuit diagram illustrating an example of a memory cell array in which the memory cells 1010 are arranged in a matrix. Such a memory cell array can be used for a memory device or an integrated circuit including a memory device.

Although one transistor 200 is electrically connected to all the memory cells in the memory cell array in FIG. 2C, this embodiment is not limited thereto. The transistor 200 may be provided for each row in the memory cell array as illustrated in FIG. 2D. Although not illustrated, the transistor 200 may be provided for each column in the memory cell array, or the following configuration may be employed: a memory cell array is divided into a plurality of blocks and the transistor 200 is provided for each of the blocks.

<Structure Example of Semiconductor Device 1000b>

Figure 3A:
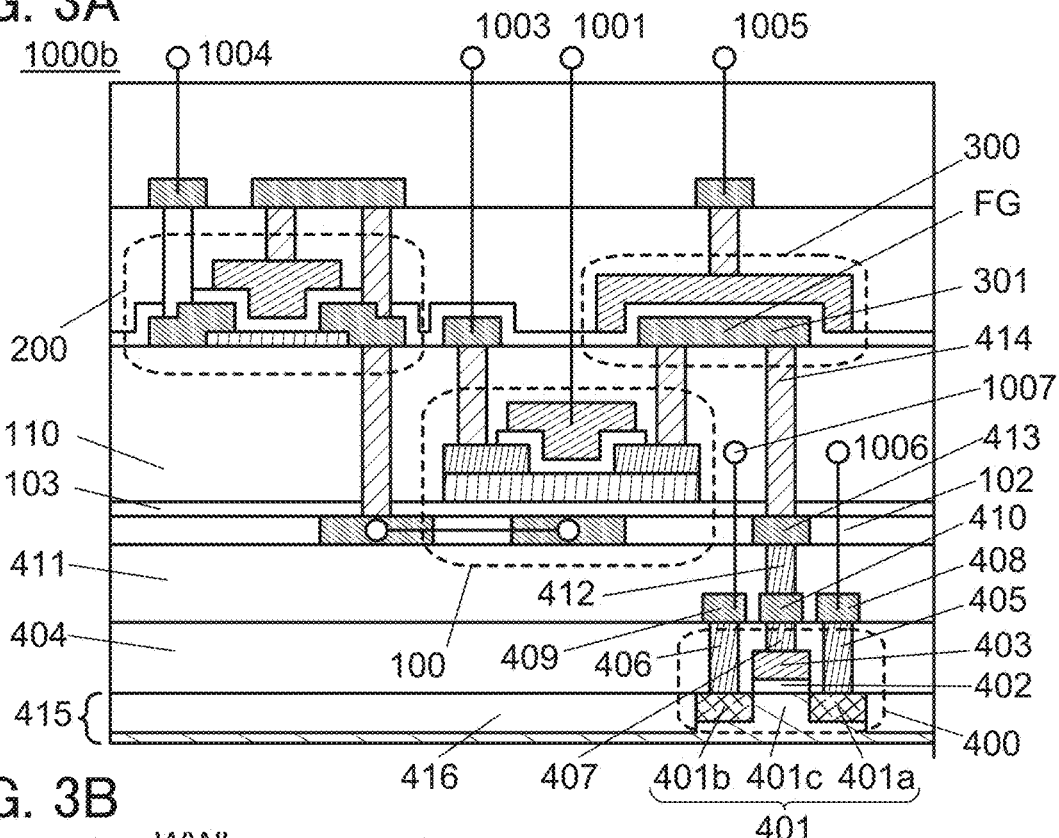
FIGS. 3A to 3D are a cross-sectional view and circuit diagrams of semiconductor devices of embodiments of the present invention.
Figure 3B:
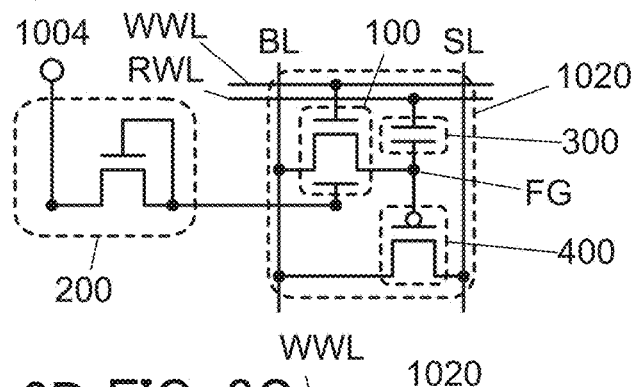
Figures 3C, 3D:
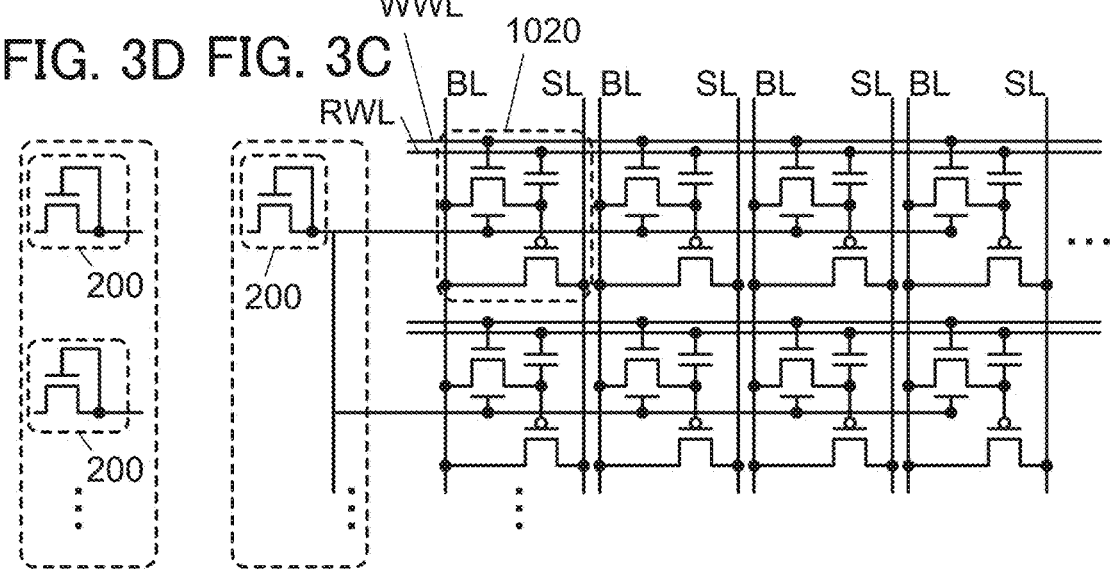

FIG. 3A is a cross-sectional view of a semiconductor device 1000b, FIG. 3B is a circuit diagram of the semiconductor device 1000b, and FIG. 3C is a circuit diagram illustrating an application example using the semiconductor device 1000b. The semiconductor device 1000b includes the transistor 100, the transistor 200, the capacitor 300, and the transistor 400. The transistors 100 and 200 have different structures. The transistor 100 is provided over the insulators 411 and 404 provided to cover the transistor 400, and the transistor 200 and the capacitor 300 are provided in the same layer over the insulator 110 provided to cover the transistor 100.

In FIG. 3A, the transistors 100 and 200 and the capacitor 300 in the semiconductor device 1000 or the semiconductor device 1000a that are described above can be used as the transistors 100 and 200 and the capacitor 300; thus, the description thereof is not repeated. The transistor 400 includes a semiconductor 401, an insulator 402, and a conductor 403. The semiconductor 401 is formed in a semiconductor substrate 415, and a region 401a functioning as one of a source region and a drain region, a region 401b functioning as the other of the source region and the drain region, and a region 401c that is located between the region 401a and the region 401b and functions as a channel are provided in the semiconductor 401. In the case where a plurality of semiconductors 401 is provided in the semiconductor substrate 415, an insulator 416 is provided between the adjacent semiconductors 401.

The insulator 402 is provided over the region 401c. The insulator 402 can be provided to cover the entire semiconductor 401 or cover the semiconductor substrate 415 as long as the insulator 402 is at least provided over the region 401c.

The insulator 404 is provided over the semiconductor substrate 415 to cover the transistor 400. Conductors 405, 406, and 407 are provided to be embedded in the insulator 404. The conductor 405 is electrically connected to the region 401a, the conductor 406 is electrically connected to the region 401b, and the conductor 407 is electrically connected to the conductor 403. Conductors 408, 409, and 410 are provided over the insulator 404. The conductor 408 is electrically connected to the conductor 405, the conductor 409 is electrically connected to the conductor 406, and the conductor 410 is electrically connected to the conductor 407.

The insulator 411 is provided over the insulator 404 to cover the conductors 408, 409, and 410. A conductor 412 is provided to be embedded in the insulator 411. The insulator 102, the transistor 100, the transistor 200, the capacitor 300, and the like are provided over the insulator 411. A conductor 413 is provided to be embedded in the insulator 102. The conductor 413 is electrically connected to the conductor 412. A conductor 414 is provided to be embedded in the insulators 103 and 110. The conductor 414 is electrically connected to the conductor 413 and the conductor 301 functioning as the first electrode of the capacitor 300.

The conductor 408 is electrically connected to a terminal 1006, and the conductor 409 is electrically connected to a terminal 1007.

Electrically connecting the transistor 100, the transistor 200, the capacitor 300, and the transistor 400 as in FIG. 3A allows the semiconductor device 1000b to constitute a memory element (memory cell).

FIG. 3B is a circuit diagram corresponding to FIG. 3A and illustrates a configuration where a memory cell 1020 includes the transistor 100, the capacitor 300, and the transistor 400 and the transistor 200 is electrically connected to the first gate of the transistor 100. The terminals 1001, 1003, 1005, 1006, and 1007 in FIG. 3A are electrically connected to a write word line WWL, a bit line BL, a read word line RWL, a source line SL, and the bit line BL in FIG. 3B, respectively. Here, a portion in which a gate of the transistor 400, the one of the source electrode and the drain electrode of the transistor 100, and the first electrode of the capacitor 300 are electrically connected to one another may be referred to as a node FG.

Data writing by the memory cell 1020 will be described. The potential of the write word line WWL is set to a potential at which the transistor 100 is turned on, to turn on the transistor 100, so that the potential of the bit line BL is supplied to the gate of the transistor 400 and the first electrode of the capacitor 300. That is, a predetermined charge is supplied to the gate of the transistor 400. Here, one of charges corresponding to two different potentials (hereinafter, a charge for supplying a low potential is referred to as a charge $Q_L$ and a charge for supplying a high potential is referred to as a charge $Q_H$) is selectively supplied to the gate of the transistor 400. When one of $Q_L$ and $Q_H$ corresponds to data "1" and the other corresponds to data "0" here, one-bit data can be written to the memory cell. Note that the storage capacity of the semiconductor device 1000b may be increased in such a manner that multilevel data (data of a plurality of bits) is written to each memory cell by selecting a charge to be supplied to the gate of the transistor 400 among charges corresponding to three or more different potentials.

Then, the potential of the write word line WWL is lowered so that the transistor 100 is turned off, whereby the charge supplied to the gate of the transistor 400 and the first electrode of the capacitor 300 is stored.

As described above, the transistor 400 is turned on and the potential of the source or the drain of the transistor 400 is set to a fixed potential of the source line SL. Thus, the potential supplied to the gate of the transistor 400 and the first electrode of the capacitor 300 is not influenced by a reduction in the potential of the write word line WWL in storing charge, and a reduction in the potential supplied to the gate of the transistor 400 and the first electrode of the capacitor 300 can be suppressed.

The off-state current of the transistor 100 is extremely small; thus, the charge in the gate of the transistor 400 is stored for a long period of time.

Next, data reading will be described. When an appropriate potential (reading potential) is supplied to the read word line RWL with a predetermined potential (constant potential) supplied to the source line SL, the resistance of the source or the drain of the transistor 400 varies depending on the amount of charge stored in the gate of the transistor 400. This is because in general, when the transistor 400 is a p-channel transistor, an apparent threshold voltage $V_{thH}$ of the transistor 400 in the case where $Q_H$ is supplied to the gate of the transistor 400 is lower than an apparent threshold voltage $V_{thL}$ of the transistor 400 in the case where $Q_L$ is supplied to the gate of the transistor 400. Here, an apparent threshold voltage refers to the potential of the read word line RWL, the potential required to turn on the transistor 400. Thus, the potential of the read word line RWL is set to a potential V0 that is between $V_{thH}$ and $V_{thL}$, whereby charge supplied to the gate of the transistor 400 in writing data can be determined. For example, in the case where $Q_H$ is supplied to the gate of the transistor 400 in data writing, the transistor 400 is turned off when the potential of the read word line RWL is set to V0 ($<V_{thL}$). In the case where $Q_L$ is supplied to the gate of the transistor 400 in data writing, the transistor 400 is turned on when the potential of the read word line RWL is V0 ($>V_{thH}$). In this manner, stored data can be read when the resistance of the transistor 400 is determined.

The use of a transistor with higher carrier mobility and a larger on-state current as the transistor 100 enables data writing and data reading to and from the memory cell 1020 in the semiconductor device 1000b to be performed at higher speed.

Furthermore, the transistor 200 is connected to the conductor 101 functioning as the first gate of the transistor 100, whereby the threshold value of the transistor 100 is controlled, and data can be held in the memory cell 1020 for a long period of time. For example, shifting the threshold value of the transistor 100 to the positive direction further decreases a drain current when the gate voltage of the transistor 100 is 0 V, so that data can be held in the memory cell 1020 for a long period of time. In particular, the use of a transistor with a smaller drain current at a gate voltage of 0 V as the transistor 200 enables charge supplied to the conductor 101 to be stored for a long period of time with lower power consumption.

FIG. 3C is a circuit diagram illustrating an example of a memory cell array in which the memory cells 1020 are arranged in a matrix. Such a memory cell array can be used for a memory device or an integrated circuit including a memory device.

Although one transistor 200 is electrically connected to all the memory cells in the memory cell array in FIG. 3C, this embodiment is not limited thereto. The transistor 200 may be provided for each row in the memory cell array as illustrated in FIG. 3D. Although not illustrated, the transistor 200 may be provided for each column in the memory cell array, or the following configuration may be employed: a memory cell array is divided into a plurality of blocks and the transistor 200 is provided for each of the blocks.

<Structure Example of Transistor 100a>

Figure 4:
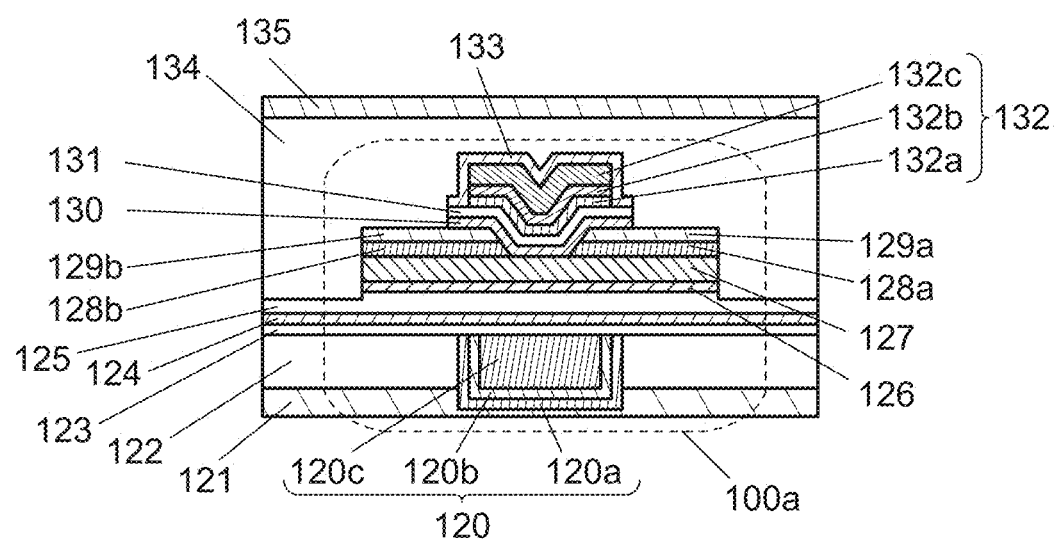
FIG. 4 illustrates a cross-sectional structure of a transistor of one embodiment of the present invention.

FIG. 4 illustrates a structure example that can be used for the transistor 100. A transistor 100a includes a conductor 120, an insulator 123 over the conductor 120, an insulator 124 over the insulator 123, an insulator 125 over the insulator 124, an oxide 126 over the insulator 125, an oxide 127 over the oxide 126, conductors 128a and 128b over the oxide 127, a barrier 129a over the conductor 128a, a barrier 129b over the conductor 128b, an oxide 130 over the oxide 127 and the barriers 129a and 129b, an insulator 131 over the oxide 130, a conductor 132 over the insulator 131, and a barrier 133 that is over the insulator 131 and covers the conductor 132.

The conductor 120 functions as a first gate electrode. The conductor 120 has a structure in which a plurality of conductors are stacked, and is composed of conductors 120a, 120b, and 120c in this embodiment. The conductor 120 is provided to be embedded in the insulators 121 and 122.

Here, it is preferable to use a conductive material that has a function of inhibiting the passage of impurities such as water and hydrogen (that is relatively impermeable to such impurities) for the conductor 120a. The conductor 120a is a single layer or a stack, preferably formed using any of tantalum, tantalum nitride, ruthenium, ruthenium oxide, and the like, for example. Thus, diffusion of impurities such as hydrogen and water from a layer under the insulator 121 into an upper layer through the conductor 120 can be inhibited. Note that it is preferable that at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom and oxygen (e.g., an oxygen atom or an oxygen molecule) be less likely to penetrate the conductor 120a. Furthermore, hereinafter, the same applies to the description of a conductive material that is relatively impermeable to impurities. When the conductors 120a has a function of inhibiting the passage of oxygen, the conductivity of the conductors 120b and 120c can be prevented from being lowered because of oxidation.

The conductor 120b is preferably formed using a conductive material such as titanium or titanium nitride. Furthermore, the conductor 120c is preferably formed using a conductive material containing tungsten, copper, or aluminum as its main component.

The insulator 121 can function as a barrier insulating film for preventing impurities such as water and hydrogen from entering the transistor 100a from a layer below the insulator 121. The insulator 121 is preferably formed using an insulating material that has a function of inhibiting the passage of impurities such as water and hydrogen and oxygen (that is relatively impermeable to such impurities), and for example, is preferably formed using aluminum oxide. This can inhibit diffusion of impurities such as hydrogen and water to a layer over the insulator 121. Note that it is preferable that at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom be less likely to penetrate the insulator 121. Furthermore, hereinafter, the same applies to the description of an insulating material that is relatively impermeable to impurities.

Furthermore, for the insulator 121, an insulating material that is relatively impermeable to oxygen (e.g., an oxygen atom or an oxygen molecule) is preferably used. With this material, oxygen contained in the insulator 125 or the like can be prevented from being diffused to lower layers.

The insulator 124 is preferably formed using an insulating material that is relatively impermeable to impurities such as water and hydrogen and oxygen, and for example, is preferably formed using aluminum oxide or hafnium oxide. In that case, diffusion of impurities such as hydrogen and water from a layer under the insulator 124 to a layer over the insulator 124 can be inhibited. Furthermore, oxygen contained in the insulator 125 or the like can be inhibited from diffusing into lower layers.

Furthermore, the concentration of impurities such as water, hydrogen, and nitrogen oxide in the insulator 125 is preferably lowered. The amount of hydrogen released from the insulator 125 that is converted into hydrogen molecules per unit area of the insulator 125 is less than or equal to $2\times10^{15}$ molecules/cm$^2$, preferably less than or equal to $1\times10^{15}$ molecules/cm$^2$, more preferably $5\times10^{14}$ molecules/cm$^2$ in thermal desorption spectroscopy (TDS) analysis in the range from 50° C. to 500° C., for example. Moreover, the insulator 125 is preferably formed using an insulator from which oxygen is released by heating.

The insulators 123, 124, and 125 can function as a first gate insulating film, and the insulator 131 can function as a second gate insulating film. Although the insulators 123, 124, and 125 are stacked in the transistor 100a, the present invention is not limited to this structure. For example, any two of the insulators 123, 124, and 125 may be stacked, or any one of the insulators may be used.

The oxides 126, 127, and 130 are preferably formed using a metal oxide functioning as an oxide semiconductor (hereinafter also referred to as an oxide semiconductor). The metal oxide preferably has an energy gap of 2 eV or more, preferably 2.5 eV or more. With the use of a metal oxide having such a wide energy gap, the off-state current of the transistor can be reduced.

A transistor formed using an oxide semiconductor has an extremely small leakage current in an off state; thus, a semiconductor device with low power consumption can be provided. An oxide semiconductor can be formed by a sputtering method or the like and thus can be used in a transistor included in a highly integrated semiconductor device.

The oxide semiconductor preferably contains at least indium or zinc. In particular, indium and zinc are preferably contained. In addition, aluminum, gallium, yttrium, tin, or the like is preferably contained. Furthermore, one or more kinds of elements selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide containing indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also called a metal oxide in some cases. Moreover, a metal oxide containing nitrogen may be called a metal oxynitride.

Here, the atomic ratio of the element M to constituent elements in the metal oxide used as the oxide 126 is preferably greater than that in the metal oxide used as the oxide 127. Moreover, the atomic ratio of the element M to In in the metal oxide used as the oxide 126 is preferably greater than that in the metal oxide used as the oxide 127.

In the case where the metal oxide that can be used as the oxide 126 is used as the oxide 130, it is preferable that the energy of the conduction band minimum of the oxide 130 be higher than the energy of the conduction band minimum of a region of the oxide 127 where the energy of the conduction band minimum is low. In other words, the electron affinity of the oxide 130 is preferably lower than the electron affinity of the region of the oxide 127 where the energy of the conduction band minimum is low.

Here, the energy level of the conduction band minimum gradually varies between the metal oxides 126, 127, and 130. In other words, the energy level of the conduction band minimum continuously varies or is continuously connected. To obtain such an energy level, the densities of defect states in mixed layers formed at an interface between the oxides 126 and 127 and an interface between the oxides 127 and 130 are preferably made low.

Specifically, when the oxides 126 and 127 contain the same element (as a main component) in addition to oxygen and the oxides 127 and 130 contain the same element (as a main component) in addition to oxygen, mixed layers each with a low density of defect states can be formed. For example, in the case where the oxide 127 is an In—Ga—Zn oxide, it is preferable to use an In—Ga—Zn oxide, a Ga—Zn oxide, gallium oxide, or the like as the oxides 126 and 130.

At this time, a narrow-gap portion formed in the oxide 127 serves as a main carrier path. Since the densities of defect states at the interface between the oxides 126 and 127 and the interface between the oxides 127 and 130 can be made low, the influence of interface scattering on carrier conduction is small, and high on-state current can be obtained.

Alternatively, the metal oxide that can be used as the oxide 127 may be used as the oxide 130.

For example, in the case where the oxides 126, 127, and 130 are each an In—Ga—Zn oxide, the composition of In, Ga, and Zn in the oxide 126 can be In:Ga:Zn=1:3:4 or 1:3:2. The composition of In, Ga, and Zn in the oxide 127 can be In:Ga:Zn=4:2:3 or 1:1:1. The composition of In, Ga, and Zn in the oxide 130 can be In:Ga:Zn=1:3:2, 4:2:3, 1:1:1, or 1:3:4.

The thickness of the oxide 126 can be greater than or equal to 3 nm and less than or equal to 50 nm, preferably greater than or equal to 3 nm and less than or equal to 20 nm, more preferably greater than or equal to 3 nm and less than or equal to 10 nm. The thickness of the oxide 127 can be greater than or equal to 10 nm and less than or equal to 50 nm, preferably greater than or equal to 10 nm and less than or equal to 25 nm. The thickness of the oxide 130 can be greater than or equal to 3 nm and less than or equal to 20 nm, preferably greater than or equal to 3 nm and less than or equal to 10 nm.

The conductors 128a and 128b function as source and drain electrodes. The conductors 128a and 128b are preferably formed using a conductive material containing tungsten, titanium, tantalum, or the like as its main component, specifically, a conductive material such as tungsten, titanium nitride, or tantalum nitride.

The barriers 129a and 129b are provided to cover the conductors 128a and 128b, respectively. The barriers 129a and 129b are preferably formed using an atomic layer deposition (ALD) method. An ALD method allows the barriers 129a and 129b to be formed to have a thickness greater than or equal to 1 nm and less than or equal to 20 nm, preferably greater than or equal to 1 nm and less than or equal to 10 nm. Note that many precursors used for an ALD method include impurities such as carbon. Thus, the barriers 129a and 129b include impurities such as carbon. For example, even when the barriers 129a and 129b and the insulator 121 are formed using aluminum oxide, the amount of impurities such as carbon in the barriers 129a and 129b is larger than that in the insulator 121 in some cases. Note that impurities can be quantified by X-ray photoelectron spectroscopy (XPS).

The barriers 129a and 129b are preferably formed using an insulating material having a function of inhibiting the passage of impurities such as water and hydrogen and oxygen, and for example, are preferably formed using aluminum oxide or hafnium oxide. In that case, oxidation of the conductors 128a and 128b can be inhibited.

The insulator 131 is preferably provided in contact with the top surface of the oxide 130. The insulator 131 is preferably formed using an insulator from which oxygen is released by heating. When the insulator 131 is provided in contact with the top surface of the oxide 130, oxygen can be effectively supplied to the oxide 127 through the oxide 130. Furthermore, the concentration of impurities such as water and hydrogen in the insulator 131 is preferably lowered as in the insulator 125. The thickness of the insulator 131 is preferably greater than or equal to 1 nm and less than or equal to 20 nm, preferably greater than or equal to 1 nm and less than or equal to 5 nm.

The insulator 131 preferably contains oxygen. For example, the amount of released oxygen molecules per unit area of the insulator 131 is more than or equal to $1 \times 10^{14}$ molecules/cm$^2$, preferably more than or equal to $2 \times 10^{14}$ molecules/cm$^2$, more preferably more than or equal to $4 \times 10^{14}$ molecules/cm$^2$ in thermal desorption spectroscopy (TDS) analysis in the range of a surface temperature from 100° C. to 700° C. or from 100° C. to 500° C.

The conductor 132 functions as a second gate electrode. The conductor 132 has a structure in which a plurality of conductors are stacked, and is composed of conductors 132a, 132b, and 132c in this embodiment. As the conductor 132a, a conductive oxide is preferably used. For example, the metal oxide that can be used as the oxide 126, 127, or 130 can be used. In particular, an In—Ga—Zn-based oxide with an atomic ratio of In:Ga:Zn=4:2:3 to 4:2:4.1 or in the neighborhood thereof, which has high conductivity, is preferably used. When the conductor 132a is formed using such a material, oxygen can be prevented from entering the conductor 132b, and an increase in electric resistivity of the conductor 132b due to oxidation can be prevented.

When such a conductive oxide is deposited by a sputtering method, oxygen can be added to the insulator 131, and oxygen can be supplied to the oxide 127. Thus, oxygen vacancies in the oxide 127 can be reduced.

As the conductor 132b, a conductor that can add impurities such as nitrogen to the conductor 132a to improve the conductivity of the conductor 132a may be used. For example, titanium nitride or the like is preferably used for the conductor 132b. The conductor 132c can be formed using a metal such as tungsten, for example. A structure can be employed in which a metal such as tungsten is stacked as the conductor 132c over a meal nitride such as titanium nitride used as the conductor 132b.

Here, the conductor 132 functioning as a second gate electrode is provided to cover the top surface and a side surface in the channel width direction of the oxide 127 with the insulator 131 and the oxide 130 therebetween. Thus, the electric field of the conductor 132 functioning as a second gate electrode can electrically surround the top surface and the side surface in the channel width direction of the metal oxide 127. The structure of the transistor in which the channel formation region is electrically surrounded by the electric field of the conductor 132 is referred to as a surrounded channel (s-channel) structure. Thus, a channel can be formed in the top surface and the side surface in the channel width direction of the oxide 127; therefore, a large amount of current can flow between the source and the drain, and a current in an on state (on-state current) can be large. Moreover, since the top surface and the side surface in the channel width direction of the metal oxide 127 are surrounded by the electric field of the conductor 132, a leakage current in an off state (off-state current) can be small.

The barrier 133 is provided to cover the conductor 132. The barrier 133 is preferably formed using an atomic layer deposition (ALD) method. An ALD method allows the barrier 133 to be formed to have a thickness greater than or equal to 1 nm and less than or equal to 20 nm, preferably greater than or equal to 1 nm and less than or equal to 10 nm. Note that many precursors used for an ALD method include impurities such as carbon. Thus, the barrier 133 includes impurities such as carbon. For example, even when the barrier 133 and the insulator 121 are formed using aluminum oxide, the amount of impurities such as carbon in the barrier 133 is larger than that in the insulator 121 in some cases. Note that impurities can be quantified by X-ray photoelectron spectroscopy (XPS).

The barrier 133 is preferably formed using an insulating material having a function of inhibiting the passage of impurities such as water and hydrogen and oxygen, and for example, are preferably formed using aluminum oxide or hafnium oxide. Accordingly, diffusion of oxygen from the insulator 131 to the outside can be inhibited. Furthermore, oxidation of the conductor 132 can be inhibited.

An insulator 134 is preferably provided to cover the transistor 100a. Furthermore, the concentration of impurities such as water and hydrogen in the insulator 134 is preferably lowered as in the insulator 125.

Moreover, an insulator 135 is preferably provided over the insulator 134. The insulator 135 can function as a barrier insulating film that prevents impurities such as water and hydrogen from entering the transistor or the like from a layer over the insulator 135. Like the insulator 121, the insulator 135 is preferably formed using an insulating material that is relatively impermeable to oxygen and impurities such as water and hydrogen, e.g., aluminum oxide.

An oxide insulator formed by an ALD method, which is used for the barriers 129a, 129b, and 133, may be provided over or below the insulator 135.

<Structure Example of Transistor 200a>

Figure 5A:
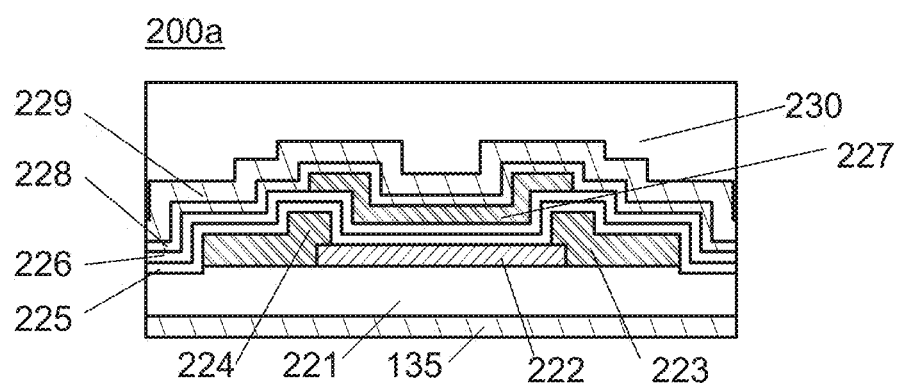
FIGS. 5A and 5B each illustrate a cross-sectional structure of a transistor of one embodiment of the present invention.

FIG. 5A illustrates the structure of a transistor 200a that can be used for the transistor 200. The transistor 200a is provided over the insulator 221 over the insulator 135 covering the transistor 100a. The transistor 200a includes an oxide 222 over the insulator 221, conductors 223 and 224 electrically connected to the oxide 222, insulators 225 and 226 covering the oxide 222 and the conductors 223 and 224, and a conductor 227 over the insulator 226. The transistor 200a is covered with insulators 228, 229, and 230.

The oxide 222 is preferably formed using a metal oxide functioning as an oxide semiconductor, and for example, can be formed using a metal oxide that can be used for the oxides 126, 127, and 130. For example, the oxide 222 is formed using the same material as any one of the oxides 126, 127, and 130. In this case, the thickness of the oxide 222 is adjusted in accordance with a property needed for the transistor 200a. The transistor 200 needs to have a lower drain current at a gate voltage of 0 V. In the case where the oxide 127 in the transistor 100a and the oxide 222 are each an oxide containing In, Ga, and Zn, the ratio of In in the oxide 222 is preferably lower than the ratio of In in the oxide 127. The use of such oxides for the transistors 100a and 200a enables the transistor 100a to have higher carrier mobility or a larger on-state current and the transistor 200a to have a smaller drain current at a gate voltage of 0 V. Note that an oxide similar to that in the transistor 200a is preferably used in a transistor 200b to be described below. The thickness of the oxide 222 may be set larger than that of the oxide 130 in the transistor 100a.

For example, in the case where the oxide 222 is an In—Ga—Zn oxide, the composition of In, Ga, and Zn in the oxide 222 can be In:Ga:Zn=1:3:2, 4:2:3, 1:1:1, or 1:3:4.

The thickness of the oxide 222 can be greater than or equal to 3 nm and less than or equal to 40 nm, preferably greater than or equal to 3 nm and less than or equal to 15 nm. The thickness of the oxide 222 can be greater than that of the oxide 130 in the transistor 100a. For example, when the thickness of the oxide 130 is 3 nm, the thickness of the oxide 222 can be greater than or equal to 4 nm and less than or equal to 15 nm, for example, 5 nm. When the thickness of the oxide 130 is 5 nm, the thickness of the oxide 222 can be greater than or equal to 6 nm and less than or equal to 15 nm, for example, 10 nm. The thickness of the oxide 222 is determined in accordance with the electrical characteristics of the transistor 200a or the transistor 200b to be described later, that is, the electrical characteristics of the transistor 200 or the composition of the oxide 222. To decrease the drain current when a gate voltage applied to the transistor 200 is 0 V, the thickness of the oxide 222 is reduced, and is preferably set to greater than or equal to 3 nm and less than 10 nm, more preferably greater than or equal to 3 nm and less than or equal to 5 nm. Depending on a material of the oxide 222, even when the oxide 222 has a large thickness, the drain current when a gate voltage applied to the transistor 200 is 0 V can be small. In such a case, the thickness of the oxide 222 is set to greater than or equal to 10 nm and less than or equal to 40 nm, preferably greater than or equal to 10 nm and less than or equal to 15 nm.

One of the conductors 223 and 224 function as a source electrode, and the other function as a drain electrode. The conductors 223 and 224 are preferably formed using a conductive material containing tungsten, titanium, tantalum, aluminum, or the like as its main component, more preferably a conductive material such as tungsten, titanium nitride, or tantalum nitride.

The insulators 225 and 226 function as gate insulating films, and at least one of the insulators 225 and 226 is preferably an insulator formed by an ALD method. The insulator formed by an ALD method is preferably aluminum oxide or hafnium oxide, for example. For example, aluminum oxide deposited by an ALD method can be used as the insulator 225, and silicon oxynitride, silicon oxide, or the like deposited by a CVD method can be used as the insulator 226.

The conductor 227 functions as a gate electrode. The conductor 227 is preferably formed using a conductive material containing tungsten, titanium, tantalum, aluminum, or the like as its main component, more preferably a single layer of any of conductive materials such as tungsten, titanium nitride, and tantalum nitride or a stack thereof.

The insulator 228 is preferably formed using the same material as the barriers 129a and 129b. Aluminum oxide, hafnium oxide, or the like deposited by an ALD method is preferably used as the insulator 228.

The insulator 229 is preferably formed using an insulating material having a function similar to those of the insulators 121 and 135, and for example, is preferably formed using aluminum oxide. Stacking the insulators 228 and 229 can prevent impurities such as hydrogen and water from entering the transistor 200 or the transistor 100 and can prevent oxygen and the like from diffusing to a layer over the insulator 229.

<Structure Example of Transistor 200b>

Figure 5B:
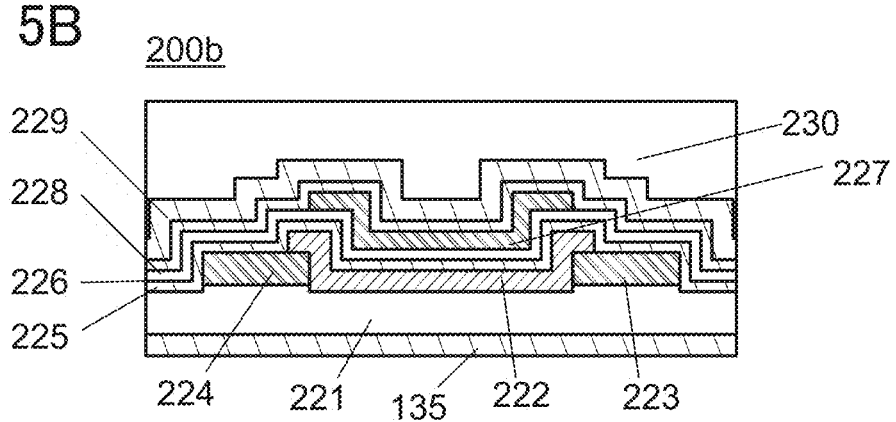

FIG. 5B illustrates a structure example of a transistor that can be used for the transistor 200. The order of stacking the oxide 222 and the conductors 223 and 224 in the transistor 200b is different from that in the transistor 200a. The transistor 200b can be fabricated in such a manner that the conductors 223 and 224 are formed and then the oxide 222 is provided to cover at least part of the conductors 223 and 224. For components having the same reference numbers as the components of the transistor 200a, description of the transistor 200a can be referred to, and the components are not described in detail.

<Structure Example of Capacitor 300a>

Figure 6A:
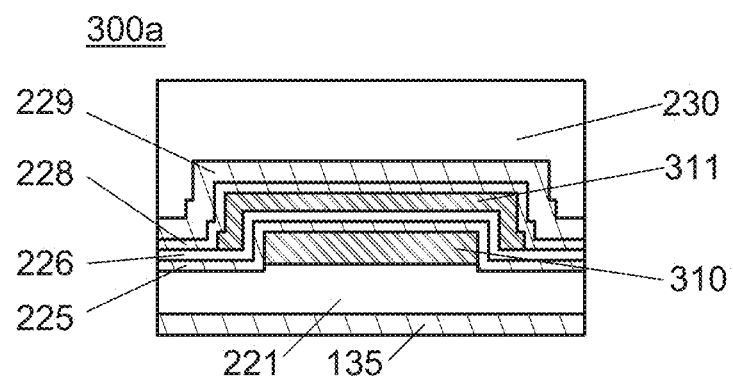
FIGS. 6A and 6B each illustrate a cross-sectional structure of a capacitor of one embodiment of the present invention.

FIG. 6A illustrates the structure of a capacitor 300a that can be used for the capacitor 300. Note that the capacitor 300 can be formed in the same layer as the transistor 200 to share one or some of the components of the transistor 200. For the same reference numerals, description of the transistor 200a and the like can be referred to, and the detailed description is omitted. The capacitor 300a includes a conductor 310 over the insulator 221, the insulators 225 and 226 provided to cover the conductor 310, and a conductor 311 over the insulator 226. The capacitor 300a is covered with the insulators 228, 229, and 230.

The conductor 310 can be formed with the same material in the same process as the conductors 223 and 224, for example. The conductor 311 can be formed with the same material in the same process as the conductor 227, for example.

The insulators 225 and 226, which are used as gate insulating films in the transistor 200a and the like, function as dielectrics in the capacitor 300a. The conductor 311 is preferably provided to also cover side surfaces of the conductor 310 with the insulators 225 and 226 therebetween, in which case the capacitance value of the capacitor 300a is increased by that corresponding to the area of the side surfaces of the conductor 310.

<Structure Example of Capacitor 300b>

Figure 6B:
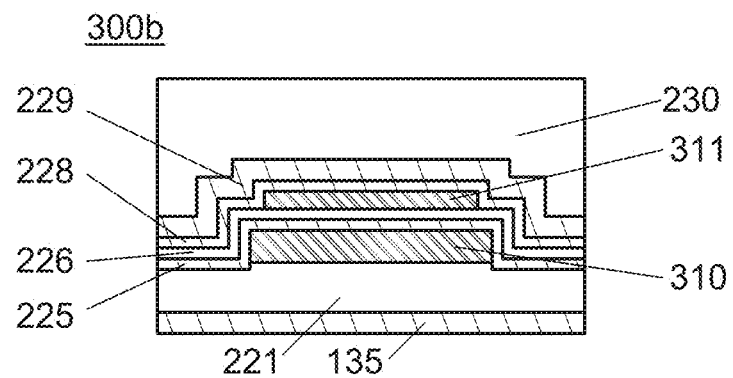

FIG. 6B illustrates another structure example of a capacitor that can be used for the capacitor 300. In the capacitor 300b, the conductor 311 does not cover side surfaces of the conductor 310 and faces only the top surface of the conductor 310. The capacitance value of the capacitor 300b depends on the area of the bottom surface of the conductor 311. For components having the same reference numbers as the components of the capacitor 300a, description of the capacitor 300a can be referred to, and the components are not described in detail.

<Structure Example of Transistor 400a>

Figure 7A:
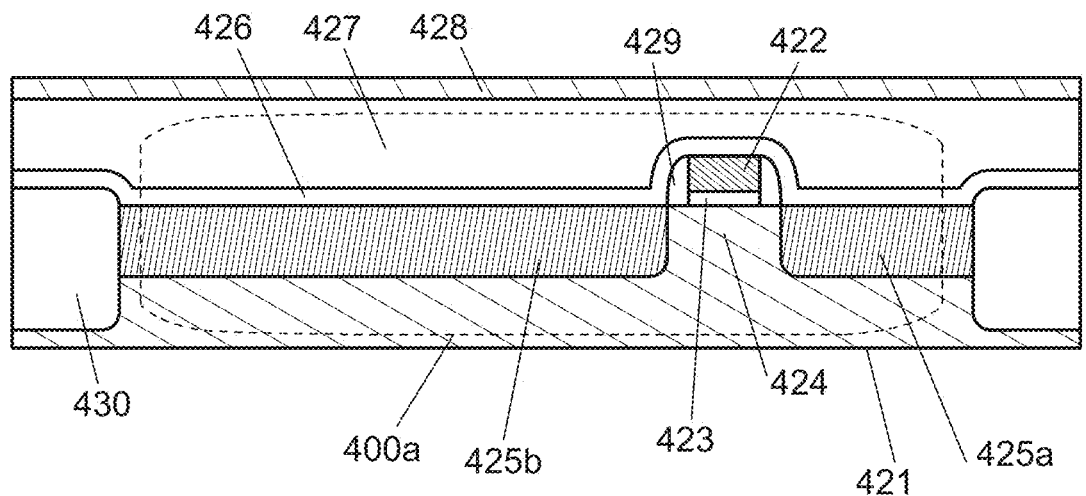
FIGS. 7A and 7B each illustrate a cross-sectional structure of a transistor of one embodiment of the present invention.

FIG. 7A illustrates the structure of a transistor that can be used for the transistor 400. A transistor 400a is provided in and on a substrate 421 and includes a conductor 422, an insulator 423, a semiconductor region 424, which is part of the substrate 421, and low-resistance regions 425a and 425b functioning as source and drain regions.

The transistor 400a can be either a p-channel transistor or an n-channel transistor.

It is preferable that a region of the semiconductor region 424 where a channel is formed, a region in the vicinity thereof, the low-resistance regions 425a and 425b functioning as source and drain regions, and the like contain a semiconductor such as a silicon-based semiconductor, more preferably single crystal silicon. Alternatively, a material containing germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 400a may be a high-electron-mobility transistor (HEMT) with GaAs, GaAlAs, or the like.

The low-resistance regions 425a and 425b contain an element that imparts n-type conductivity, such as arsenic or phosphorus, or an element that imparts p-type conductivity, such as boron, in addition to the semiconductor material used for the semiconductor region 424.

The conductor 422 functioning as a gate electrode can be formed using a semiconductor material such as silicon containing an element that imparts n-type conductivity (e.g., arsenic or phosphorus) or an element that imparts p-type conductivity (e.g., boron), or a conductive material such as a metal material, an alloy material, or a metal oxide material.

Note that the work function of a conductor is determined by a material of the conductor, whereby a threshold voltage can be adjusted. Specifically, it is preferable to use titanium nitride, tantalum nitride, or the like as the conductor. Furthermore, in order to ensure the conductivity and embeddability of the conductor, it is preferable to use a stack of metal materials such as tungsten and aluminum as the conductor. In particular, tungsten is preferable in terms of heat resistance.

An insulator 426, an insulator 427, and an insulator 428 are stacked in this order to cover the transistor 400a.

Note that the transistor 400a illustrated in FIG. 7A is only an example and is not limited to the structure illustrated therein; an appropriate transistor can be used as the transistor 400a in accordance with a circuit configuration or a driving method. Side surfaces of the conductor 422 and the insulator 423 may be provided with an insulator 429. The insulator 429 allows control of the widths of a channel formation region, a region in the vicinity of the channel formation region, and the low-resistance regions 425a and 425b functioning as source and drain regions of the semiconductor region 424. In the case where a plurality of transistors 400a are provided in and on the substrate 421, an insulator 430 is provided between the adjacent transistors 400a.

<Structure Example of Transistor 400b>

Figure 7B:
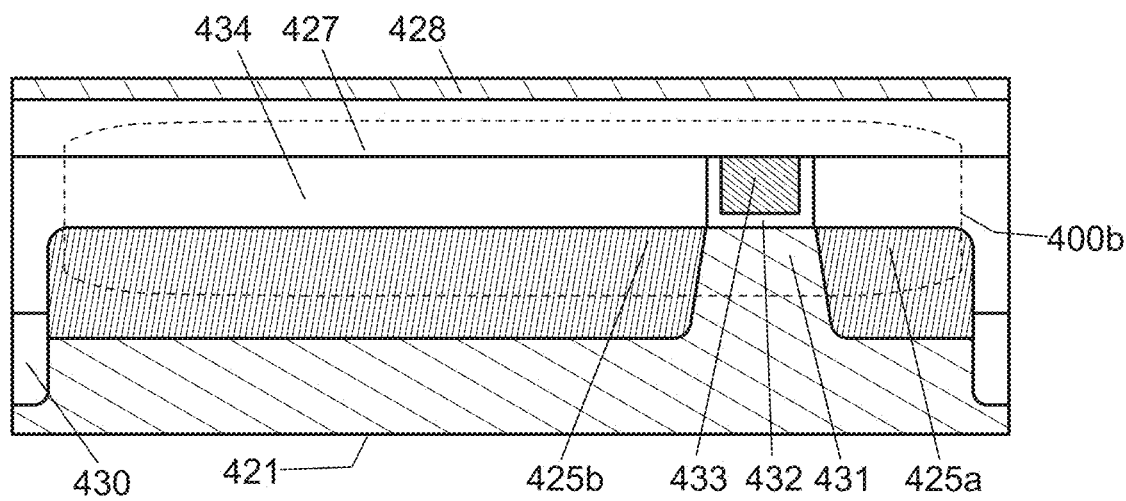

FIG. 7B illustrates another structure example of a transistor that can be used for the transistor 400. In the transistor 400b, a semiconductor region 431 (part of the substrate 421) in which a channel is formed includes a protruding portion. Furthermore, a conductor 433 is provided to cover side surfaces and the top surface of the semiconductor region 431 with an insulator 432 therebetween. Note that the conductor 433 may be formed using a material for adjusting the work function. The insulator 432 and the conductor 433 are provided to be embedded in the insulator 434 provided over the semiconductor region 431 and the low-resistance regions 425a and 425b. The transistor 400b is also referred to as a FIN transistor because it utilizes a protruding portion of the semiconductor substrate. An insulator functioning as a mask for forming the protruding portion may be provided in contact with the top surface of the protruding portion. Although the case where the protruding portion is formed by processing part of the semiconductor substrate is described here, a semiconductor film having a protruding portion may be formed by processing an SOI substrate.

<Structural Example of Semiconductor Device 1100a>

Figure 8:
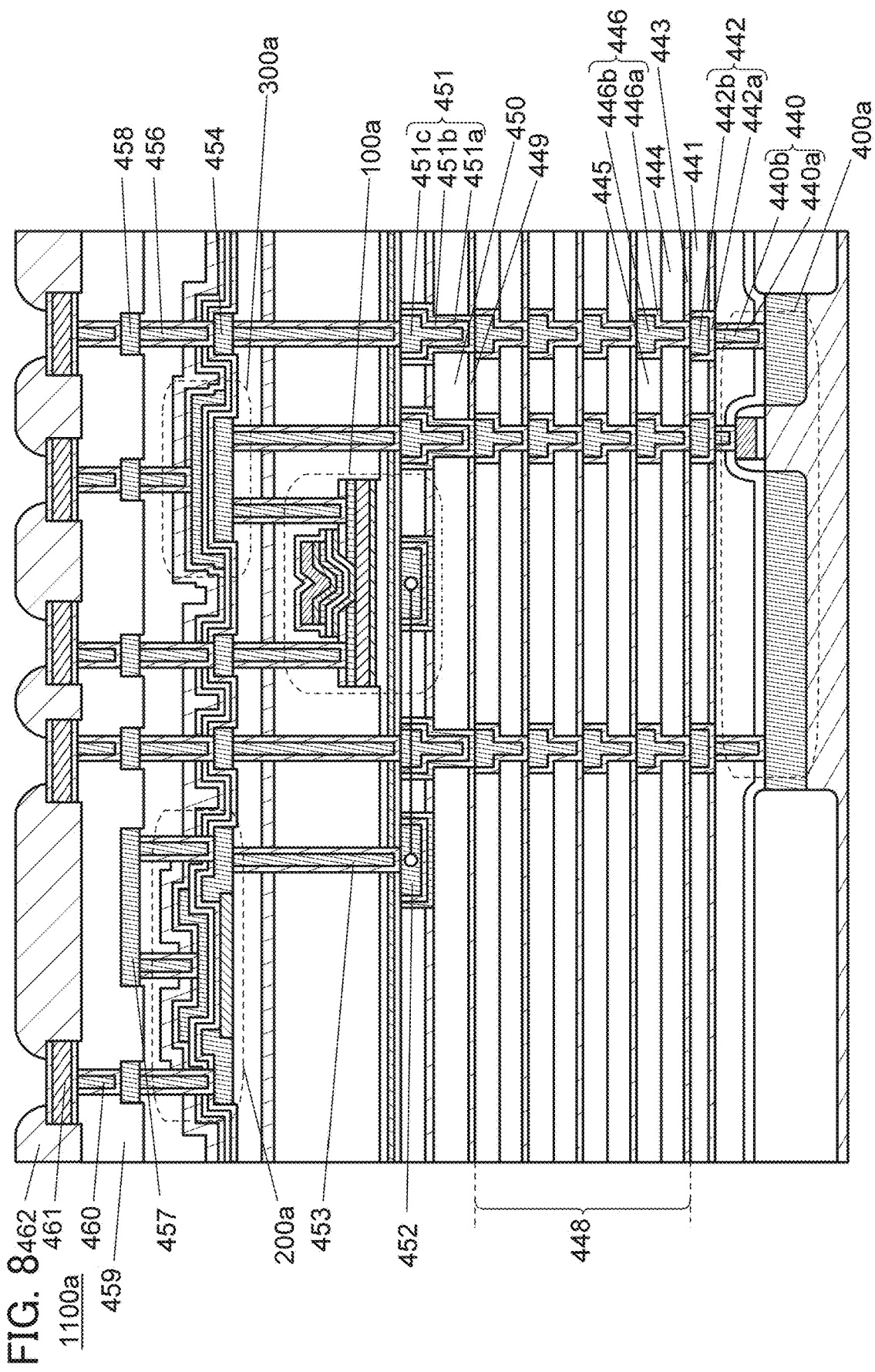
FIG. 8 illustrates a cross-sectional structure of a semiconductor device of one embodiment of the present invention.

FIG. 8 is a schematic cross-sectional view of a semiconductor device 1100a of one embodiment of the present invention. The semiconductor device 1100*a* corresponds to the semiconductor device 1000*b* in which the transistor 100*a*, the transistor 200*a*, the capacitor 300*a*, and the transistor 400*a* are used instead of the transistor 100, the transistor 200, the capacitor 300, and the transistor 400. For the components, the above description can be referred to, and detailed description thereof is omitted.

Conductors 440 are electrically connected to a source, a drain, and a gate of the transistor 400*a*. The conductors 440 are provided to be embedded in the insulators 426 and 427. Each conductor 440 has a layered structure of conductors 440*a* and 440*b*. The conductor 440*a* is preferably formed using a single layer of any of conductive materials such as titanium, titanium nitride, tantalum, and tantalum nitride or a stack thereof. The conductor 440*b* is preferably formed using a conductive material such as tungsten.

An insulator 441 is provided over the insulator 428, and conductors 442 are provided to be embedded in the insulators 428 and 441. The conductors 442 are electrically connected to the source, the drain, and the gate of the transistor 400*a* through the conductors 440. The conductor 442 has a layered structure of conductors 442*a* and 442*b*. The conductor 442*a* is preferably formed using a single layer of any of conductive materials such as titanium, titanium nitride, tantalum, and tantalum nitride or a stack thereof. The conductor 442*b* is preferably formed using a conductive material such as copper, tungsten, or aluminum.

A wiring layer 448 is provided over the insulator 441 and the conductor 442. The wiring layer 448 is formed by stacking a plurality of stages of layers each composed of insulators 443, 444, and 445 and conductors 446. Although the wiring layer 448 has four stages of layers in this embodiment, the number of stages of layers is not limited to four. The wiring layer 448 may have three or less or five or more layers.

The insulator 443 preferably has a function of preventing diffusion of impurities such as hydrogen and water and a metal component such as copper and can be formed using silicon nitride or silicon nitride oxide. The insulators 444 and 445 are preferably formed using a material with a low dielectric constant to prevent parasitic capacitance between wirings or conductors. The insulators 444 and 445 can be formed using silicon oxide, silicon oxynitride, or silicon oxide containing carbon or hydrogen, for example.

The conductors 446 are provided to be embedded in the insulators 443, 444, and 445. The conductor 446 has a layered structure of conductors 446*a* and 446*b*. The conductor 446*a* is preferably formed using a single layer of any of conductive materials such as titanium, titanium nitride, tantalum, and tantalum nitride or a stack thereof. The conductor 446*b* is preferably formed using a conductive material such as copper, tungsten, or aluminum.

Insulators 449 and 450 are provided over the wiring layer 448. The conductors 451 are provided to be embedded in the insulators 449, 450, 121, and 122.

The insulator 449 preferably has a function of preventing diffusion of impurities such as hydrogen and water and a metal component such as copper and can be formed using silicon nitride or silicon nitride oxide. The insulator 450 is preferably formed using a material with a low dielectric constant to prevent parasitic capacitance between wirings or conductors. The insulator 450 can be formed using silicon oxide, silicon oxynitride, or silicon oxide containing carbon or hydrogen, for example.

The conductor 451 has a layered structure of conductors 451*a*, 451*b*, and 451*c* and can be formed at the same time as the conductor 120, which is composed of the conductors 120*a*, 120*b*, and 120*c* and functions as the first gate electrode of the transistor 100*a*.

The transistor 100*a* is provided over the insulator 450. The transistor 200*a* and the capacitor 300*a* are provided over the transistor 100*a*. The transistor 200*a* and the capacitor 300*a* are formed over the insulator 221, that is, they are formed in the same layer.

Conductors 453 are provided to be embedded in the insulators 123, 124, 125, 134, 135, and 221 and the like. The conductor 453 has a structure similar to those of the conductors 446 and 451.

One of a source and a drain of the transistor 200*a* is electrically connected to a conductor 452 formed to be embedded in the insulators 121 and 122, through the conductor 453. The conductor 452 is electrically connected to the conductor 120 functioning as the first gate of the transistor 100*a*. Alternatively, the conductor 452 is extended from the conductor 120. That is, the first gate of the transistor 100*a* is electrically connected to the one of the source and the drain of the transistor 200*a* through the conductors 452 and 453.

One of a source and a drain of the transistor 100*a* is electrically connected to a first electrode of the capacitor 300*a* through the conductor 453. The first electrode of the capacitor 300*a* is electrically connected to the gate of the transistor 400*a* through the conductors 453, 451, 442, and 440 and the wiring layer 448. That is, the one of the source and the drain of the transistor 100*a*, the first electrode of the capacitor 300*a*, and the gate of the transistor 400*a* are electrically connected to one another.

The conductors 456 are provided to be embedded in the insulators 225, 226, 228, 229, and 230. The conductors 456 are electrically connected to the source, the drain, and the gate of the transistor 200*a*, a second electrode of the capacitor 300*a*, a conductor 454 provided over the insulator 221, and the like.

Conductors 457 and 458 are provided over the insulator 230 and the conductors 456. The conductor 457 is electrically connected to the conductor 456 electrically connected to the gate of the transistor 200*a* and the conductor 456 electrically connected to the one of the source and the drain of the transistor 200*a*. That is, the gate and the one of the source and the drain of the transistor 200*a* are electrically connected to each other through the conductors 456 and 457; in other words, the transistor 200*a* is diode-connected. The gate and the one of the source and the drain of the diode-connected transistor 200*a* are electrically connected to the first gate of the transistor 100*a*.

An insulator 459 is provided over the insulator 230 and the conductors 457 and 458. Conductors 460 are provided to be embedded in the insulator 459, have the same structure as the conductors 446 and 451, and are electrically connected to the conductors 458.

A conductor 461 is provided over the conductor 460. An insulator 462 is provided over the insulator 459 to cover part of the conductor 461. The conductor 461 can be formed with a single layer or a stack using a conductive material containing titanium or aluminum as its main component. For example, the conductor 461 can have a three-layer structure of titanium, aluminum, and titanium. Titanium nitride may alternatively be used instead of titanium.

<Components>

The components used in the semiconductor device described above will be described below.

<Substrate>

As a substrate for formation of the semiconductor device, for example, an insulator substrate, a semiconductor substrate, or a conductor substrate may be used. As the insulator substrate, for example, a glass substrate, a quartz substrate, a sapphire substrate, a stabilized zirconia substrate (e.g., an yttria-stabilized zirconia substrate), or a resin substrate is used. As the semiconductor substrate, for example, a semiconductor substrate made of silicon, germanium, or the like, a compound semiconductor substrate made of silicon carbide, silicon germanium, gallium arsenide, indium phosphide, zinc oxide, or gallium oxide, or the like is used. The above semiconductor substrate in which an insulator region is provided, e.g., a silicon on insulator (SOI) substrate may also be used. As the conductor substrate, a graphite substrate, a metal substrate, an alloy substrate, a conductive resin substrate, or the like is used. A substrate containing a metal nitride, a substrate containing a metal oxide, or the like is used. An insulator substrate provided with a conductor or a semiconductor, a semiconductor substrate provided with a conductor or an insulator, a conductor substrate provided with a semiconductor or an insulator, or the like may also be used. Alternatively, any of these substrates over which an element is provided may be used. As the element provided over the substrate, a capacitor, a resistor, a switching element, a light-emitting element, a memory element, or the like is used.

<Insulator>

Examples of the insulator include an insulating oxide, an insulating nitride, an insulating oxynitride, an insulating nitride oxide, an insulating metal oxide, an insulating metal oxynitride, and an insulating metal nitride oxide.

Note that when the transistor is surrounded by an insulator that has a function of inhibiting the passage of oxygen and impurities such as hydrogen, the electrical characteristics of the transistor can be stabilized. For example, an insulator that has a function of inhibiting the passage of oxygen and impurities such as hydrogen is used for the insulators 121, 125, and 135.

The insulator that has a function of inhibiting the passage of oxygen and impurities such as hydrogen can have, for example, a single-layer structure or a layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulators 121, 125, and 135 can be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulators 121, 125, and 135 preferably contain aluminum oxide or hafnium oxide.

The insulators 228 and 229 can be formed using an insulator similar to those of the insulators 121, 125, and 135.

The insulators 122, 123, 125, and 131 can each be formed to have, for example, a single-layer structure or a layered structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulators 122, 123, 125, and 131 preferably contain silicon oxide, silicon oxynitride, or silicon nitride.

The insulator 123, the insulator 124, the insulator 125, and/or the insulator 131 preferably include an insulator with a high relative dielectric constant. For example, the insulator 123, the insulator 124, the insulator 125, and/or the insulator 131 each preferably contain gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like. Alternatively, the insulator 123, the insulator 124, the insulator 125, and/or the insulator 131 each preferably have a layered structure of silicon oxide or silicon oxynitride and an insulator with a high relative dielectric constant. Since silicon oxide and silicon oxynitride have thermal stability, combination of silicon oxide or silicon oxynitride with an insulator with a high relative dielectric constant allows the layered structure to be thermally stable and have a high relative dielectric constant. For example, when aluminum oxide, gallium oxide, or hafnium oxide is in contact with the oxides 126 and 127 or the oxide 130 in the insulators 125 and 131, silicon contained in silicon oxide or silicon oxynitride can be prevented from entering the oxides 126, 127, and 130. Furthermore, for example, when silicon oxide or silicon oxynitride is in contact with the oxides 126 and 127 or the oxide 130 in the insulators 125 and 131, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulators 225 and 226 can be formed using an insulator similar to those of the insulators 122, 123, 125, and 131.

The insulators 122 and 134 each preferably contain an insulator with a low dielectric constant. For example, the insulators 122 and 134 each preferably contain silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators 122 and 134 each preferably have a layered structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the layered structure can have thermal stability and a low dielectric constant. Examples of the resin include polyester, polyolefin, polyamide (e.g., nylon or aramid), polyimide, polycarbonate, and acrylic.

The insulators 221, 230, 427, 441, 444, 445, 450, 459, and 462 can be formed using an insulator similar to those of the insulators 122 and 134.

An insulator having a function of inhibiting the passage of oxygen and impurities such as hydrogen can be used as each of the barriers 129a, 129b, and 133. The barriers 129a, 129b, and 133 can prevent excess oxygen in the insulator 134 from diffusing into the conductors 128a, 128b, 132b, and 132c.

Furthermore, the barriers 129a, 129b, and 133 can be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride, for example. Note that the barriers 129a, 129b, and 133 preferably contain silicon nitride.

<Conductor>

The conductors 120a, 120b, 120c, 132a, 132b, 132c, 128a, and 128b can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having high electric conductivity typified by polycrystalline silicon including an impurity element such as phosphorus, or silicide such as nickel silicide may be used.

For the above conductors, especially for the conductors 120a and 120b, a conductive material containing oxygen and a metal element contained in a metal oxide that can be used for the oxides 126, 127, and 130 may be used. Alternatively, a conductive material containing nitrogen and any of the metal elements listed above may be used. For example, a conductive material containing nitrogen, such as titanium nitride or tantalum nitride may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, indium tin oxide to which silicon is added, or indium gallium zinc oxide containing nitrogen may be used. By using such a material, hydrogen contained in the oxides 126, 127, and 130 can be captured in some cases. Alternatively, hydrogen entering from an external insulator or the like can be captured in some cases.

A stack of a plurality of conductive layers formed using any of the above materials may be used. For example, a layered structure formed using a combination of a material containing any of the metal elements listed above and a conductive material containing oxygen may be used. Alternatively, a layered structure formed using a combination of a material containing any of the metal elements listed above and a conductive material containing nitrogen may be used. Alternatively, a layered structure formed using a combination of a material containing any of the metal elements listed above, a conductive material containing oxygen, and a conductive material containing nitrogen may be used.

Note that in the case where an oxide is used in the channel formation region of the transistor, a layered structure formed using a combination of a material containing any of the metal elements listed above and a conductive material containing oxygen is preferably used for the gate electrode. In that case, the conductive material containing oxygen is preferably provided on the channel formation region side so that oxygen released from the conductive material is easily supplied to the channel formation region.

The conductors 223, 224, 227, 310, 311, 440a, 440b, 442a, 442b, 446a, 446b, 451a, 451b, 451c, 453a, 453b, 454, 456, 457, 458, 460, and 461 can be formed using a conductor similar to those of the conductors 120a, 120b, 120c, 132a, 132b, 132c, 128a, and 128b.

<Metal Oxide that can be Used for Oxides>

The oxides 126, 127, 130, and 222 of one embodiment of the present invention will be described below. A metal oxide functioning as an oxide semiconductor (hereinafter also referred to as oxide semiconductor) is preferably used for the oxides 126, 127, 130, and 222.

An oxide semiconductor preferably contains at least indium or zinc. In particular, indium and zinc are preferably contained. In addition to these, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor is InMZnO containing indium, the element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also called a metal oxide in some cases. A metal oxide containing nitrogen may be called a metal oxynitride.

Here, the case where a metal oxide contains indium, the element M, and zinc is considered. The terms of the atomic ratio of indium to the element M and zinc in the metal oxide are denoted by [In], [M], and [Zn], respectively.

Preferred ranges of the atomic ratio of indium to the element M and zinc in the metal oxide that can be used for the oxides 126, 127, 130, and 222 will be described below with reference to FIGS. 9A to 9C. Note that the proportion of oxygen atoms is not shown in FIGS. 9A to 9C. The terms of the atomic ratio of indium to the element M and zinc in the metal oxide are denoted by [In], [M], and [Zn], respectively.

Figure 9A:
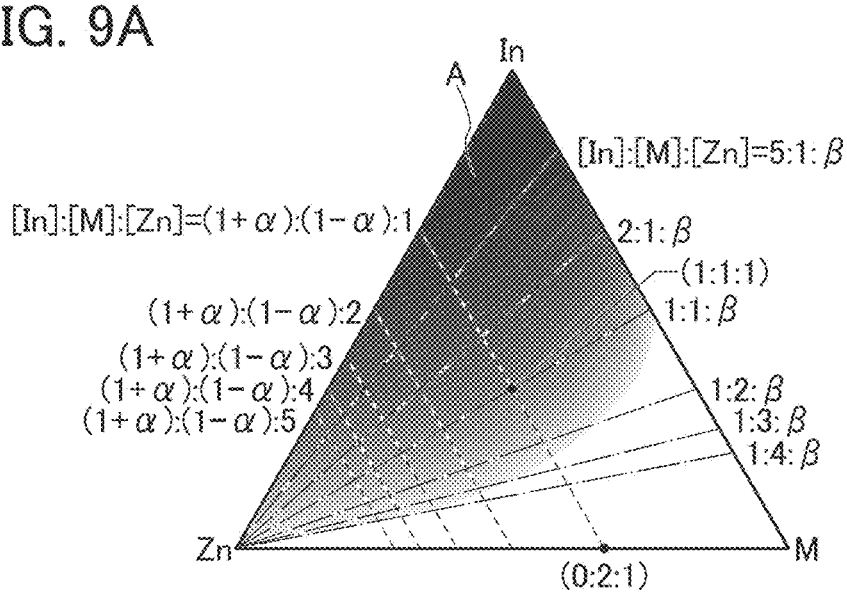
FIGS. 9A to 9C each show the range of the atomic ratio of an oxide of one embodiment of the present invention.
Figure 9B:
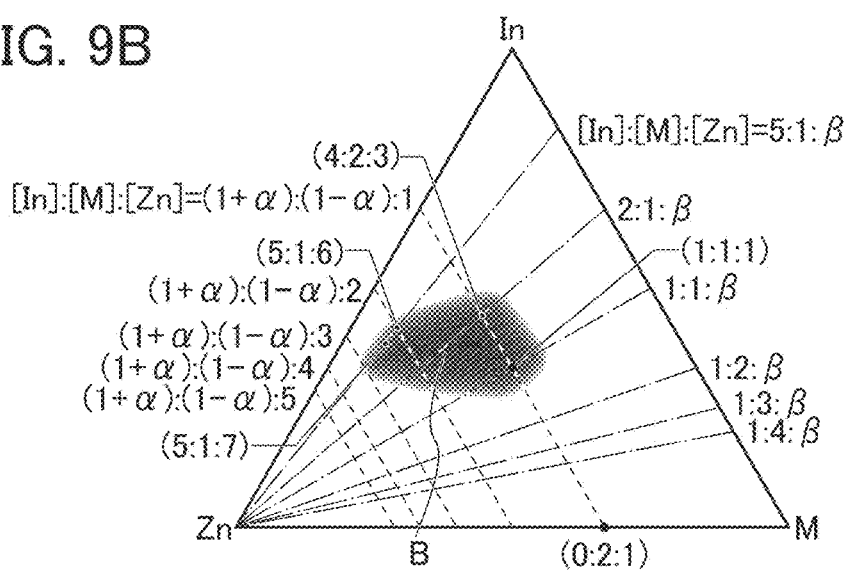
Figure 9C:
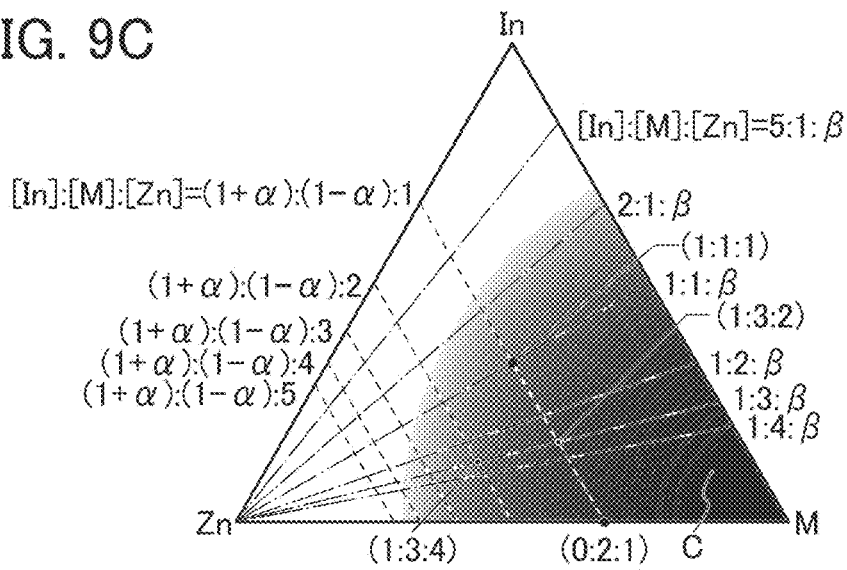

In FIGS. 9A to 9C, broken lines indicate a line where the atomic ratio [In]:[M]:[Zn] is $(1+\alpha):(1-\alpha):1$ (where $-1 \le \alpha \le 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$ (where $\beta \ge 0$), a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

Furthermore, a metal oxide with the atomic ratio of [In]:[M]:[Zn]=0:2:1 or in the neighborhood thereof in FIGS. 9A to 9C tends to have a spinel crystal structure.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

A region A in FIG. 9A shows an example of the preferred ranges of the atomic ratio of indium to the element M and zinc in a metal oxide.

In addition, a metal oxide containing indium in a higher proportion can have high carrier mobility (electron mobility). Therefore, a metal oxide having a high content of indium has higher carrier mobility than a metal oxide having a low content of indium.

In contrast, when the indium content and the zinc content in a metal oxide become lower, carrier mobility becomes lower. Thus, with an atomic ratio of [In]:[M]:[Zn]=0:1:0 and in the neighborhood thereof (e.g., a region C in FIG. 9C), insulation performance becomes better.

For example, the metal oxide used as the oxide 127 preferably has an atomic ratio represented by the region A in FIG. 9A. The metal oxide with the atomic ratio has high carrier mobility. The atomic ratio of In to Ga and Zn of the metal oxide used as the oxide 127 may be 4:2:3 to 4:2:4.1 or in the neighborhood thereof, for example. In contrast, the metal oxides used as the oxides 126 and 222 preferably have atomic ratios represented by the region C in FIG. 9C. The metal oxides with the atomic ratios have relatively excellent insulating properties. The atomic ratio of In to Ga and Zn of the metal oxide used for the oxides 126 and 222 may be approximately 1:3:4 or 1:3:2, for example. The oxide 130 may be formed using a metal oxide similar to that of the oxide 127 or 222.

A metal oxide having an atomic ratio in the region A, particularly in a region B in FIG. 9B, has high carrier mobility and high reliability and is excellent.

Note that the region B includes an atomic ratio of [In]:[M]:[Zn]=4:2:3 to 4:2:4.1 and the vicinity thereof. The vicinity includes an atomic ratio of [In]:[M]:[Zn]=5:3:4. Note that the region B includes an atomic ratio of [In]:[M]:[Zn]=5:1:6 and the vicinity thereof and an atomic ratio of [In]:[M]:[Zn]=5:1:7 and the vicinity thereof.

In the case where the metal oxide is formed of an In-M-Zn oxide, it is preferable to use a target including a polycrystalline In-M-Zn oxide as the sputtering target. Note that the atomic ratio of the formed metal oxide varies from the above atomic ratios of metal elements of the sputtering target in a range of ±40%. For example, when a sputtering target with an atomic ratio of In:Ga:Zn=4:2:4.1 is used to form the metal oxide, the atomic ratio of In to Ga and Zn in the formed metal oxide may be 4:2:3 or in the neighborhood of 4:2:3. When a sputtering target with an atomic ratio of In:Ga:Zn=5:1:7 is used to form the metal oxide, the atomic ratio of In to Ga and Zn in the formed metal oxide may be 5:1:6 or in the neighborhood of 5:1:6.

Note that the property of a metal oxide is not uniquely determined by an atomic ratio. Even with the same atomic ratio, the property of a metal oxide might be different depending on a formation condition. For example, in the case where the metal oxide is deposited with a sputtering apparatus, a film having an atomic ratio deviated from the atomic ratio of the target is formed. In particular, [Zn] in the film might be smaller than [Zn] in the target depending on the substrate temperature in deposition. Thus, the illustrated regions each represent an atomic ratio with which a metal oxide tends to have specific characteristics, and boundaries of the regions A to C are not clear.

<Composition of Metal Oxide>

Described below is the composition of a cloud-aligned composite oxide semiconductor (CAC-OS) that can be used for a transistor disclosed in one embodiment of the present invention.

In this specification and the like, "c-axis aligned crystal (CAAC)" or "cloud-aligned composite (CAC)" might be stated. Note that CAAC refers to an example of a crystal structure, and CAC refers to an example of a function or a material composition.

A CAC-OS or a CAC metal oxide has a conducting function in part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers flow mainly in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, the CAC-OS or the CAC metal oxide can be called a matrix composite or a metal matrix composite.

<Structure of Metal Oxide>

Oxide semiconductors are classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of distortion in the CAAC-OS. That is, a lattice arrangement is distorted and thus formation of a grain boundary is inhibited. This is probably because the CAAC-OS can tolerate distortion owing to a low density of oxygen atom arrangement in the a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M, Zn) layer) are stacked. Note that indium and the element M can be replaced with each other, and when the element M of the (M, Zn) layer is replaced with indium, the layer can also be referred to as an (In, M, Zn) layer. When indium of the In layer is replaced with the element M, the layer can also be referred to as an (In, M) layer.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Transistor Including Oxide>

Next, the case where the oxide is used for a transistor will be described.

Note that when the oxide is used for a transistor, carrier scattering or the like at a grain boundary can be reduced; thus, the transistor can have high field-effect mobility. In addition, the transistor can have high reliability.

An oxide with a low carrier density is preferably used for a channel formation region of the transistor. For example, an oxide whose carrier density is lower than $8 \times 10^{11}/cm^3$, preferably lower than $1 \times 10^{11}/cm^3$, more preferably lower than $1 \times 10^{10}/cm^3$, and higher than or equal to $1 \times 10^{-9}/cm^3$ is used.

A highly purified intrinsic or substantially highly purified intrinsic oxide has few carrier generation sources and thus can have a low carrier density. The highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, the transistor whose channel formation region is formed in the oxide having high density of trap states has unstable electrical characteristics in some cases.

To obtain stable electrical characteristics of the transistor, it is effective to reduce the concentration of impurities in the channel formation region. In addition, to reduce the concentration of impurities in the oxide, the concentration of impurities in a film that is adjacent to the channel formation region is preferably reduced. Examples of impurities include hydrogen, nitrogen, an alkali metal, an alkaline earth metal, iron, nickel, and silicon.

<Impurities>

Here, the influence of impurities in the oxide will be described.

When silicon or carbon that is a Group 14 element is contained in the oxide, defect states are formed. Thus, the concentration of silicon or carbon in a channel formation region and around an interface with the channel formation region in a transistor using an oxide (measured by secondary ion mass spectrometry (SIMS)) is set lower than or equal to $2 \times 10^{18}$ atoms/cm$^3$, preferably lower than or equal to $2 \times 10^{17}$ atoms/cm$^3$.

When the oxide contains an alkali metal or an alkaline earth metal, defect states are formed and carriers are generated, in some cases. Thus, a transistor including an oxide that contains an alkali metal or an alkaline earth metal in a channel formation region is likely to be normally-on. Therefore, it is preferable to reduce the concentration of an alkali metal or an alkaline earth metal in the channel formation region. Specifically, the concentration of an alkali metal or an alkaline earth metal in the oxide measured by SIMS is set lower than or equal to $1 \times 10^{18}$ atoms/cm$^3$, preferably lower than or equal to $2 \times 10^{16}$ atoms/cm$^3$.

When the oxide contains nitrogen, the oxide easily becomes n-type by generation of electrons serving as carriers and an increase of carrier density. Thus, a transistor including, as a semiconductor, an oxide that contains nitrogen in a channel formation region is likely to be normally-on. For this reason, nitrogen in the channel formation region of the oxide is preferably reduced as much as possible; the nitrogen concentration in the oxide measured by SIMS is set, for example, lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

Hydrogen contained in an oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide that contains hydrogen in a channel formation region is likely to be normally-on. Accordingly, it is preferable that hydrogen in the channel formation region be reduced as much as possible. Specifically, the hydrogen concentration in the oxide measured by SIMS is set lower than $1 \times 10^{20}$ atoms/cm$^3$, preferably lower than $1 \times 10^{19}$ atoms/cm$^3$, more preferably lower than $5 \times 10^{18}$ atoms/cm$^3$, still more preferably lower than $1 \times 10^{18}$ atoms/cm$^3$.

When an oxide with sufficiently reduced impurity concentration is used for a channel formation region in a transistor, the transistor can have stable electrical characteristics.

The structures, methods, and the like described in this embodiment can be used in appropriate combination with any of the structures, methods, and the like described in the other embodiments.

Embodiment 2

<Method for Manufacturing Semiconductor Device>

A method for manufacturing a semiconductor device of the present invention including the transistor 100a in FIG. 4, the transistor 200*a* in FIG. 5A, and the capacitor 300*a* in FIG. 6A will be described below with reference to FIGS. 10A to 10C to FIGS. 16A and 16B.

Figure 10A:
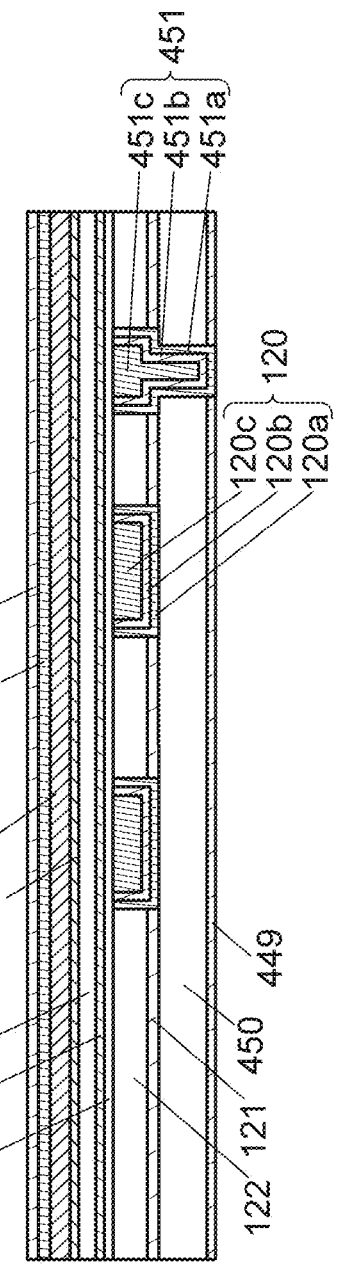
FIGS. 10A to 10C illustrate a method for manufacturing a transistor of one embodiment of the present invention.

The conductors 120 and 451 are formed over a semiconductor substrate by a single damascene method or a dual damascene method. Although not illustrated, the transistor 400*a* in FIG. 7A or the transistor 400*b* in FIG. 7B is formed in and on the semiconductor substrate, and the wiring layer 448 in FIG. 8 is formed over the transistor 400*a* or 400*b*. The insulators 449, 450, 121, and 122 are formed over the wiring layer 448, and the conductors 120 and 451 are formed to be embedded in the insulators (FIG. 10A).

The insulators 123, 124, and 125, oxides 126A, 127A, and 128A, and a barrier 129A are formed over the insulator 122 and the conductors 120 and 451. In this embodiment, the thickness of the oxide 126A is set to 5 nm, and the thickness of the oxide 127A is set to 15 nm.

Figure 10B:
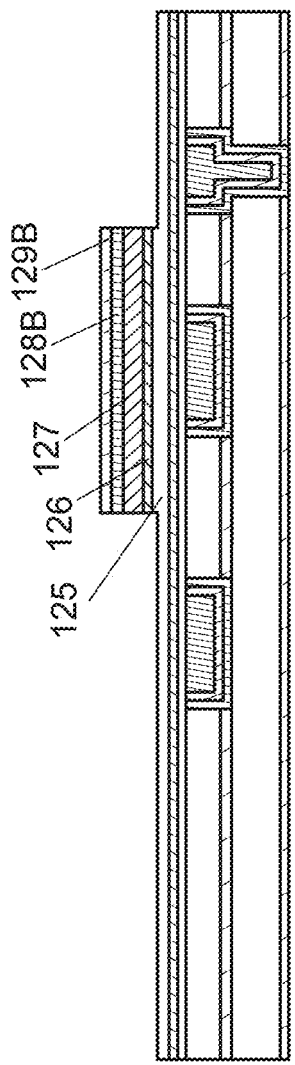

Next, the oxides 126A and 127A are processed into an island shape, so that the oxides 126 and 127 are formed (FIG. 10B). To process the oxides 126A and 127A, a resist mask or a hard mask made of a conductor or an insulator can be used. Furthermore, part of the conductor 128A or the barrier 129A may be used as a hard mask. Although not illustrated, the oxides 126A and 127A are processed using a hard mask made of tantalum nitride and part of the conductor 128A in this embodiment. Consequently, the insulator 125, a conductor 128B, and a barrier 129B are also formed.

Figure 10C:
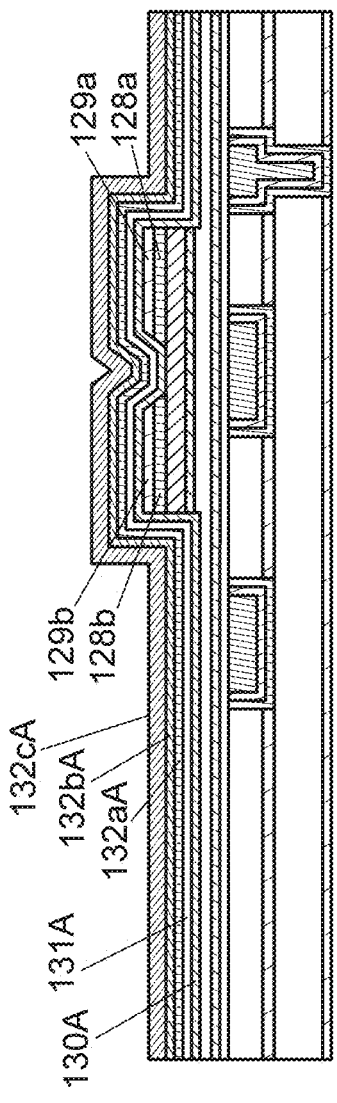

Then, the conductor 128B and the barrier 129B are processed to form conductors 128*a* and 128*b* and barriers 129*a* and 129*b* (FIG. 10C). After that, an oxide 130A, an insulator 131A, and conductors 132*a*A, 132*b*A, and 132*c*A are formed to cover the insulator 125, the oxides 126 and 127, the conductors 128*a* and 128*b*, and the barriers 129*a* and 129*b*. In this embodiment, the thickness of the oxide 130A is set to 5 nm.

Then, the conductors 132*a*A, 132*b*A, and 132*c*A are processed to form the conductors 132*a*, 132*b*, and 132*c* (FIG. 11A). After that, a barrier 133A is formed.

Then, the barrier 133A is processed to form the barrier 133 (FIG. 11B). At this time, the insulator 131A and the oxide 130A are also processed, so that the insulator 131 and the oxide 130 can be formed. Although the barrier 133A is processed such that an end portion of the barrier 133 overlaps with the barriers 129*a* and 129*b*, one embodiment of the present invention is not limited thereto. The barrier 133A may be processed such that an end portion of the barrier 133 is positioned outward from the barriers 129*a* and 129*b*, that is, outward from the oxides 126 and 127, or the barrier 133A is not necessarily processed. In processing the barrier 133A, the insulator 131A and the oxide 130A are not necessarily processed. Through the above steps, the transistor 100*a* can be formed.

Figure 12A:
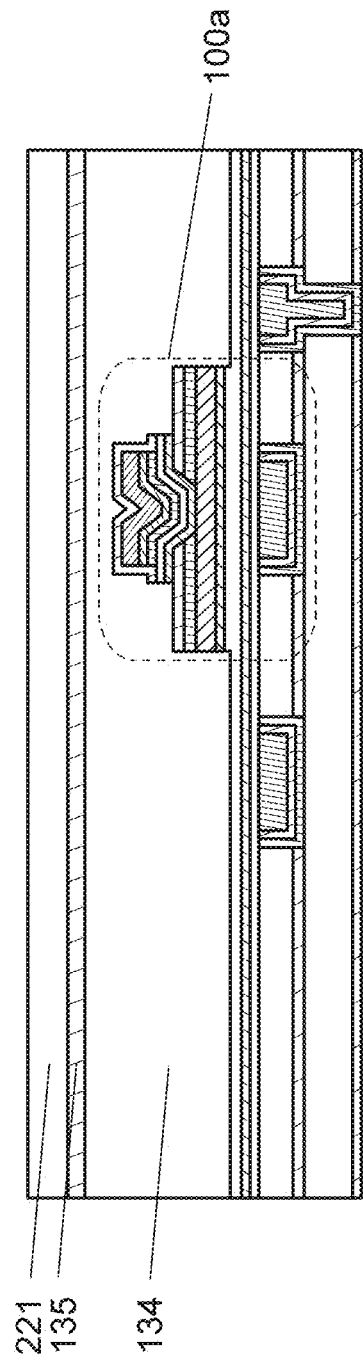
FIGS. 12A and 12B illustrate a method for manufacturing a transistor of one embodiment of the present invention.

The insulators 134, 135, and 221 are formed to cover the transistor 100*a* (FIG. 12A).

Figure 12B:
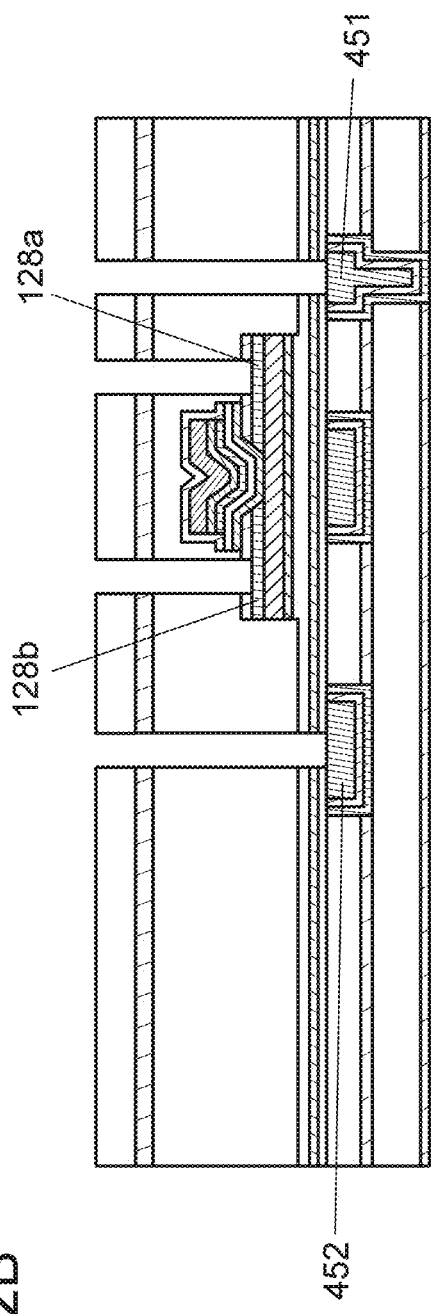

Openings are formed in the insulators 123, 124, 125, 134, 135, and 221 and the like (FIG. 12B). Although FIG. 12B illustrates openings that reach at least the conductors 451 and 452 and the conductors 128*a* and 128*b* functioning as source and drain electrodes of the transistor 100*a*, one embodiment of the present invention is not limited thereto. An opening that reaches the gate of the transistor 100*a* and an opening that reaches a conductor formed at the same time as the conductors 451 and 452 may be provided.

Next, conductors 453*a*A and 453*b*A are formed to fill the openings (FIG. 13A) by a CVD method, an ALD method, a sputtering method, or the like. At this time, the conductors 453*a*A and 453*b*A are also formed over the insulator 221.

Then, the conductors 453*a*A and 453*b*A are processed to form the conductors 453*a* and 453*b* (FIG. 13B). The conductors 453*a*A and 453*b*A are processed so that unnecessary portions of the conductors 453*a*A and 453*b*A that are located over the insulator 221, for example, are removed, and thus, polishing using chemical mechanical polishing (CMP) is performed. After that, an oxide 222A is formed. The thickness of the oxide 222A is set to 5 nm in this embodiment, but is not limited thereto. As described above, the thickness of the oxide 222A can be changed depending on the properties of the transistor 200 and the composition of the oxide 222A. For example, the thickness of the oxide 222A can be either larger or smaller than that of the oxide 130A.

Next, the oxide 222A is processed to form the oxide 222 (FIG. 14A). To process the oxide 222A, wet etching or dry etching can be employed. An etching method is determined in consideration of not only the etching rate of the oxide 222A in the etching condition of the oxide 222A but also the etching rates of the insulator 221 and the conductor 453. In the case where the oxide 222A is processed by wet etching, phosphoric acid, hydrofluoric acid, or oxalic acid can be used as an etchant. The concentration of an etchant and process time are determined in accordance with the thickness of the oxide 222A and the etching rate of the oxide 222A with respect to the etchant. In contrast, dry etching is suitable to micromachining, and is preferably used to form a minute pattern of 1 μm or less. After that, the conductor 454A is formed.

Then, the conductor 454A is processed to form conductors 223, 224, 310, and 454 (FIG. 14B). The conductors 223 and 224 are formed in contact with the oxide 222, and one of the conductors 223 and 224 functions as the source electrode of the transistor 200*a* and the other functions as the drain electrode thereof. The conductor 310 functions as the first electrode of the capacitor 300*a*. After that, the insulators 225 and 226 and a conductor 227A are formed to cover the insulator 221, the oxide 222, and the conductors 223, 224, 310, and 454.

Figure 15A:
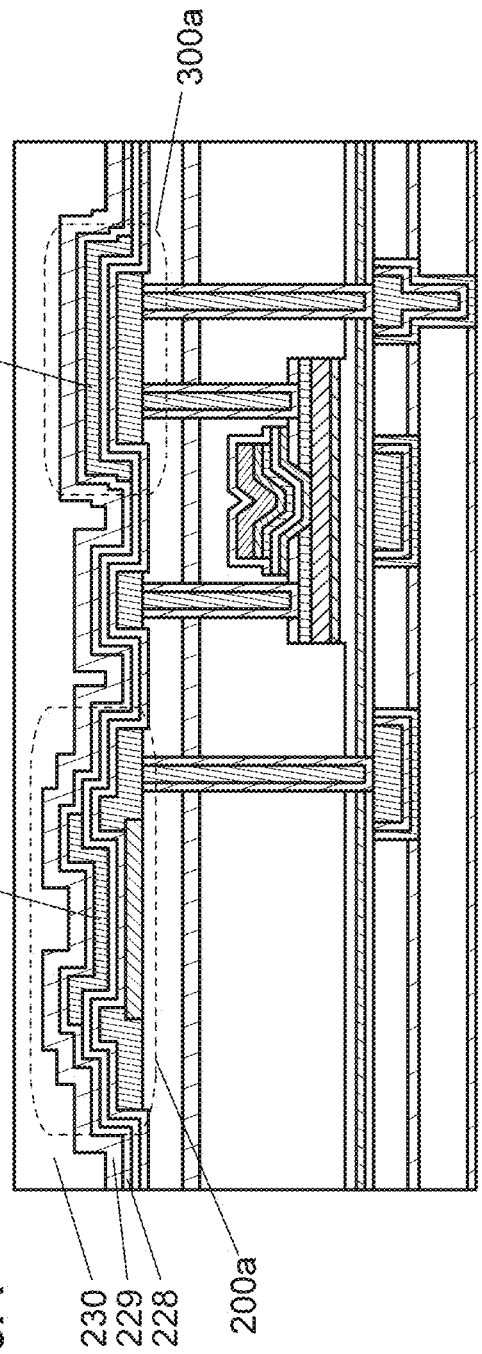
FIGS. 15A and 15B illustrate a method for manufacturing a transistor of one embodiment of the present invention.

Next, the conductor 227A is processed to form the conductors 227 and 311 (FIG. 15A). The conductor 227 functions as the gate of the transistor 200*a*, and the conductor 311 functions as the second electrode of the capacitor 300*a*. In the aforementioned manner, the transistor 200*a* and the capacitor 300*a* can be formed over the insulator 221. The insulators 228, 229, and 230 are formed to cover the transistor 200*a* and the capacitor 300*a*.

Figure 15B:
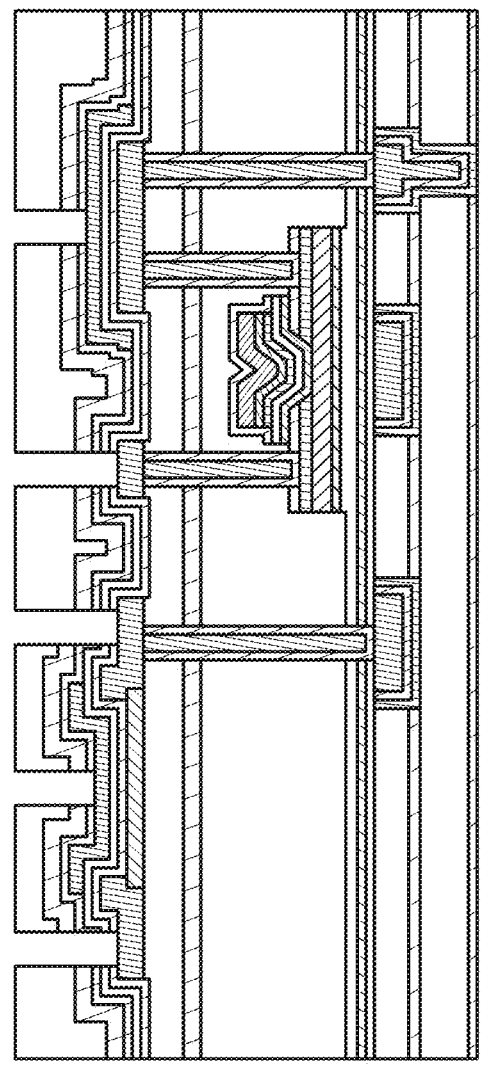

The insulators 225, 226, 228, 229, and 230 and the like are processed to form openings that reach at least the conductors 223, 224, 454, 227, and 311 (FIG. 15B).

Figure 16A:
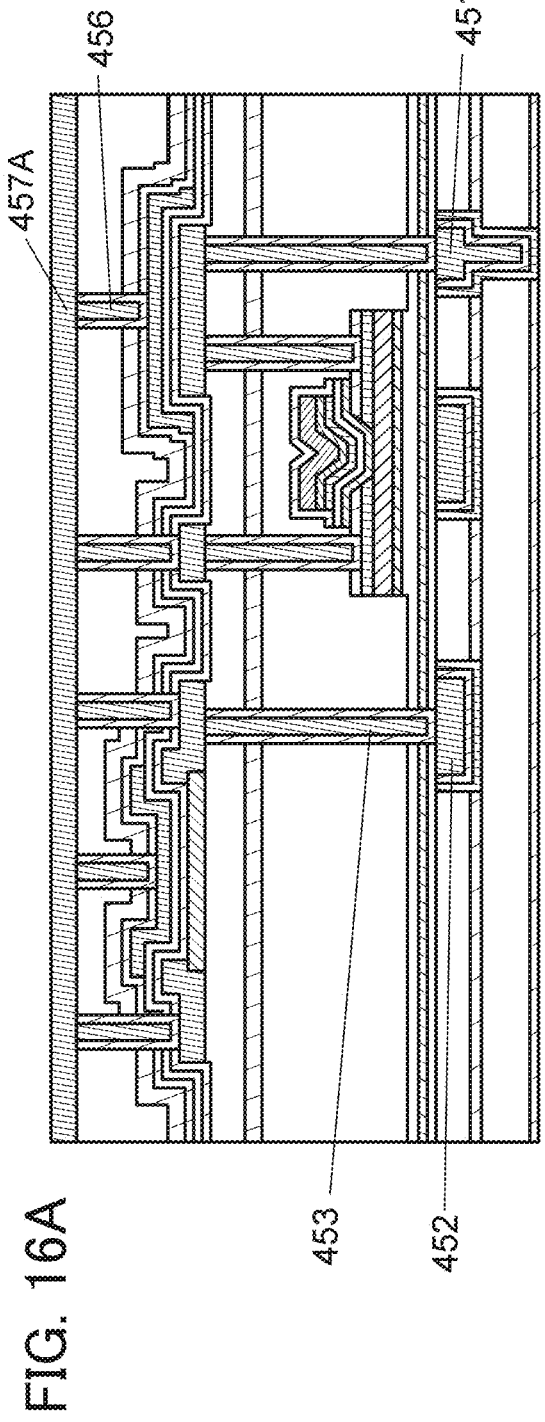
FIGS. 16A and 16B illustrate a method for manufacturing a transistor of one embodiment of the present invention.
Figure 16B:
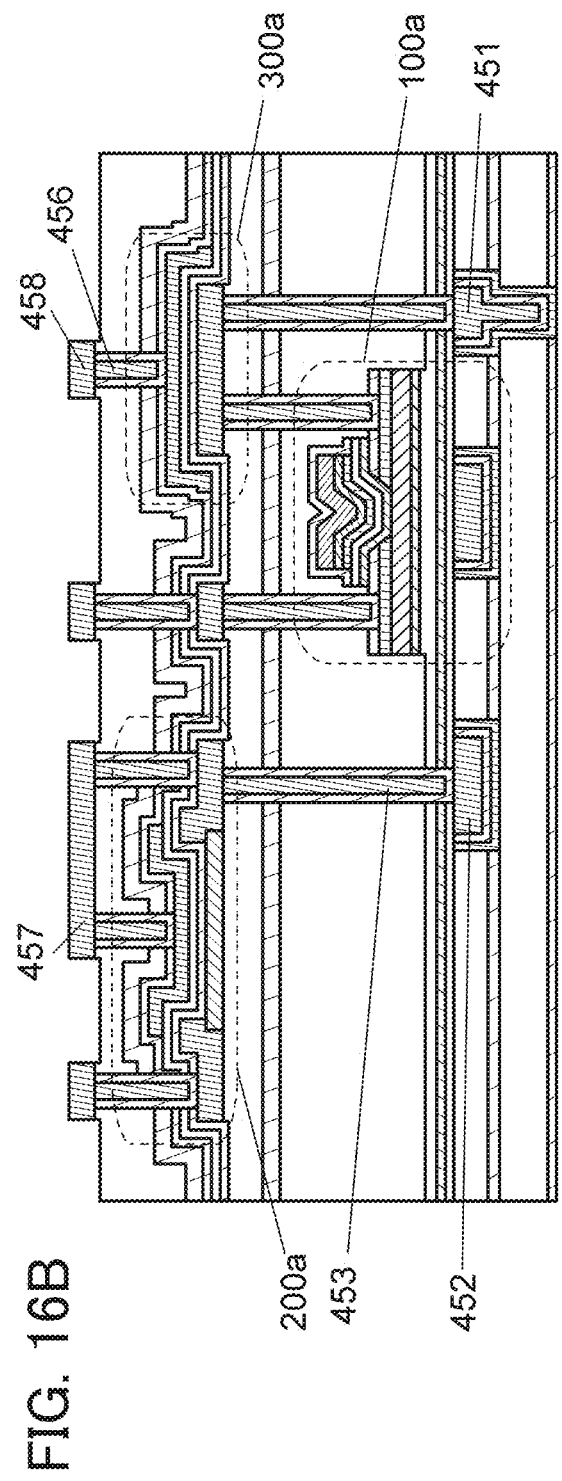

Next, the conductors 456 are formed at least in the openings, and a conductor 457A is formed to cover the insulator 230 and the conductor 456 (FIG. 16A). After that, the conductor 457A is processed to form the conductor 457 that electrically connects the gate and the one of the source and the drain of the transistor 200*a* and the conductor 458 electrically connected to the conductor 456 (FIG. 16B).

Although the transistor 200*a* is formed as the transistor 200 in FIG. 3A in this embodiment, one embodiment of the present invention is not limited thereto. Instead of the transistor 200*a*, the transistor 200*b* in FIG. 5B may be formed. In the case where the transistor 200*b* is formed, the conductor 454A is formed and processed to form the conductors 223, 224, 310, and 454, and then, the oxide 222A is formed and processed to form the oxide 222.

Instead of the capacitor 300*a*, the capacitor 300*b* in FIG. 6B may be formed.

In the aforementioned manner, the transistor 100a, the transistor 200a over the insulator 221 covering the transistor 100a, and the capacitor 300a can be formed.

The structures, methods, and the like described in this embodiment can be used in appropriate combination with any of the structures, methods, and the like described in the other embodiments.

Embodiment 3

In this embodiment, one embodiment of a semiconductor device will be described with reference to FIGS. 17A and 17B and FIGS. 18A and 18B.

<Semiconductor Wafer and Chip>

Figure 17A:
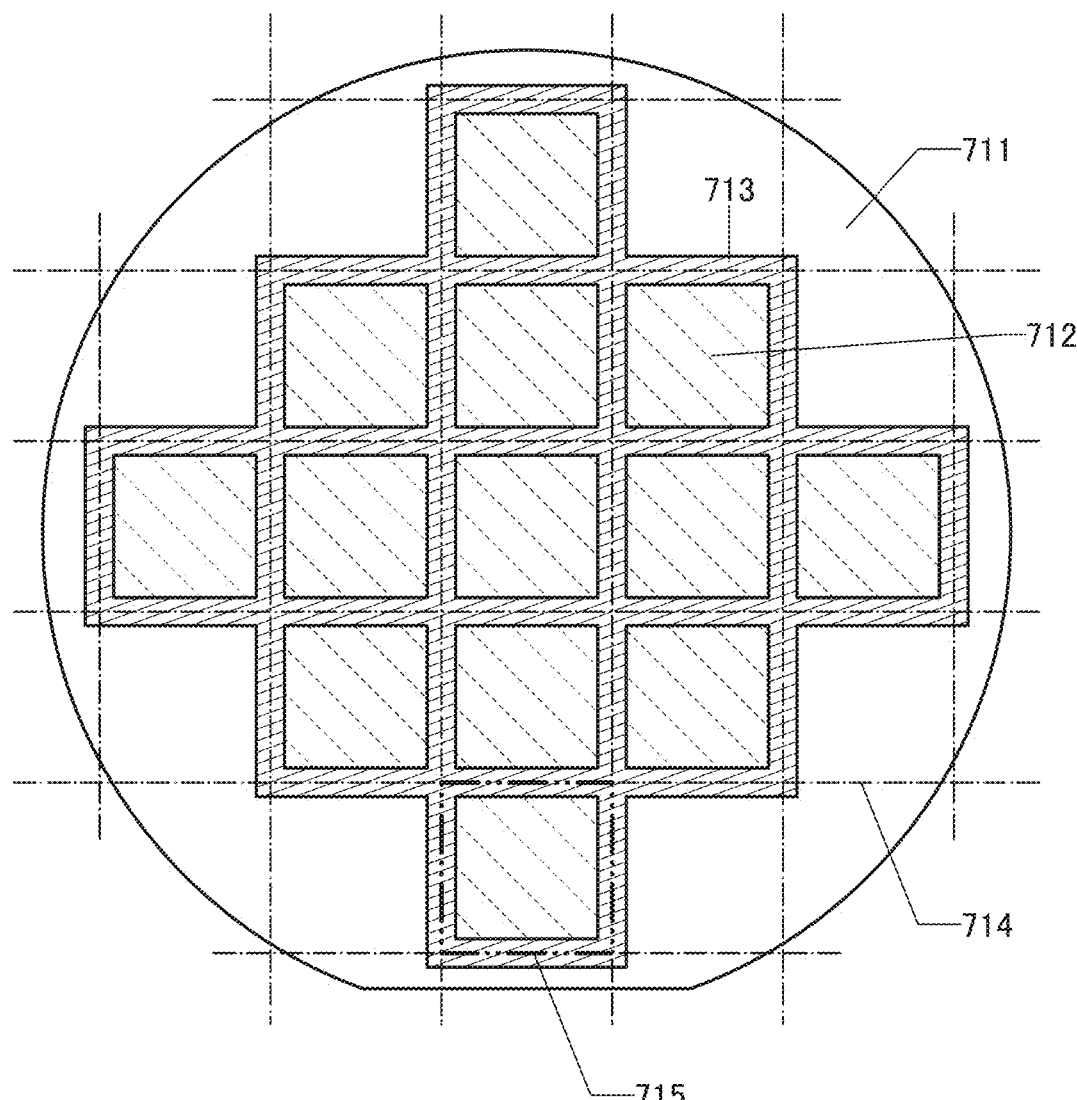
FIGS. 17A and 17B are top views of a semiconductor wafer of one embodiment of the present invention.

FIG. 17A is a top view illustrating a substrate 711 before dicing treatment. As the substrate 711, a semiconductor substrate (also referred to as a "semiconductor wafer") can be used, for example. A plurality of circuit regions 712 are provided over the substrate 711. A semiconductor device of one embodiment of the present invention, or the like, can be provided in the circuit region 712.

Figure 17B:
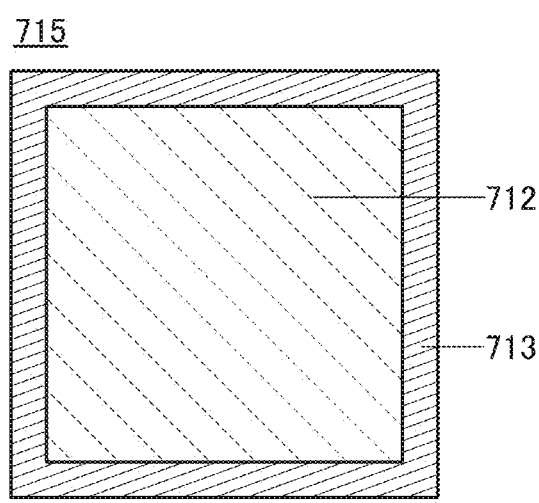

The plurality of circuit regions 712 are each surrounded by a separation region 713. Separation lines (also referred to as "dicing lines") 714 are set at a position overlapping with the separation regions 713. The substrate 711 can be cut along the separation lines 714 into chips 715 including the circuit regions 712. FIG. 17B is an enlarged view of the chip 715.

A conductive layer, a semiconductor layer, or the like may be provided in the separation regions 713. Providing a conductive layer, a semiconductor layer, or the like in the separation regions 713 relieves ESD that might be caused in a dicing step, preventing a decrease in the yield which is caused by the dicing step. A dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer, a semiconductor layer, or the like in the separation regions 713 allows a reduction in the usage of the pure water. Therefore, the cost of manufacturing semiconductor devices can be reduced. Thus, semiconductor devices can be manufactured with improved productivity.

<Electronic Component>

Figure 18A:
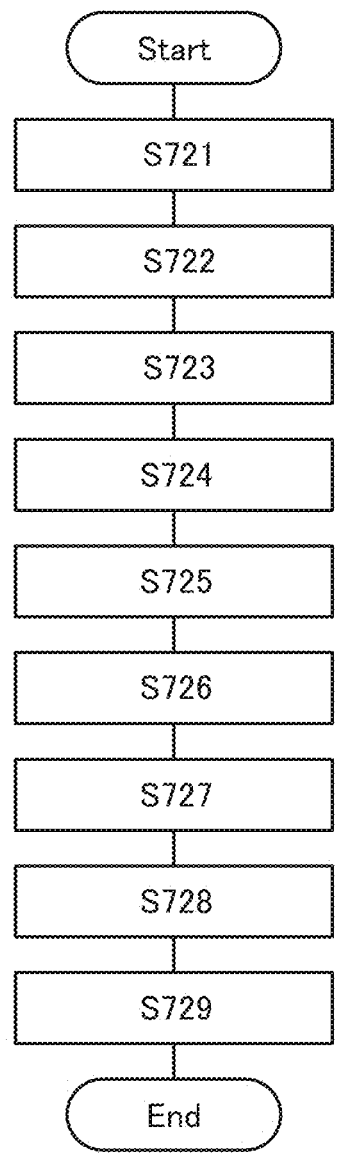
FIG. 18A is a flowchart showing a manufacturing process example of an electronic component.

In this embodiment, an example in which the chip 715 is used in an electronic component will be described with reference to FIGS. 18A and 18B. Note that the electronic component is also referred to as a semiconductor package or an IC package. The electronic component has a plurality of standards and names depending on a terminal extraction direction and a terminal shape, for example.

The electronic component is completed when the semiconductor device described in any of the above embodiments is combined with components other than the semiconductor device in an assembly process (post-process).

The post-process will be described with reference to a flow chart in FIG. 18A. After the semiconductor device of one embodiment of the present invention and the like are provided over the substrate 711 in a pre-process, a back surface grinding step in which a back surface (a surface where the semiconductor device and the like are not formed) of the substrate 711 is ground is performed (Step S721). When the substrate 711 is thinned by grinding, the size of the electronic component can be reduced.

Next, the substrate 711 is divided into a plurality of chips 715 in a dicing step (Step S722). Then, the divided chips 715 are individually bonded to a lead frame in a die bonding step (Step S723). To bond the chip 715 and a lead frame in the die bonding step, a method such as resin bonding or tape-automated bonding is selected as appropriate depending on products. Note that the chip 715 may be bonded to an interposer substrate instead of the lead frame.

Next, a wire bonding step for electrically connecting a lead of the lead frame and an electrode on the chip 715 through a metal wire is performed (Step S724). As the metal wire, a silver wire, a gold wire, or the like can be used. Ball bonding or wedge bonding can be used as the wire bonding, for example.

The wire-bonded chip 715 is subjected to a molding step of sealing the chip with an epoxy resin or the like (Step S725). Through the molding step, the inside of the electronic component is filled with a resin, so that a wire for connecting the chip 715 to the lead can be protected from external mechanical force, and deterioration of characteristics (decrease in reliability) due to moisture, dust, or the like can be reduced.

Subsequently, the lead of the lead frame is plated in a lead plating step (Step S726). This plating process prevents rust of the lead and facilitates soldering at the time of mounting the chip on a printed wiring board in a later step. Then, the lead is cut and processed in a formation step (Step S727).

Next, a printing (marking) step is performed on a surface of the package (Step S728). After a testing step (Step S729) for checking whether an external shape is good and whether there is malfunction, for example, the electronic component is completed.

Figure 18B:
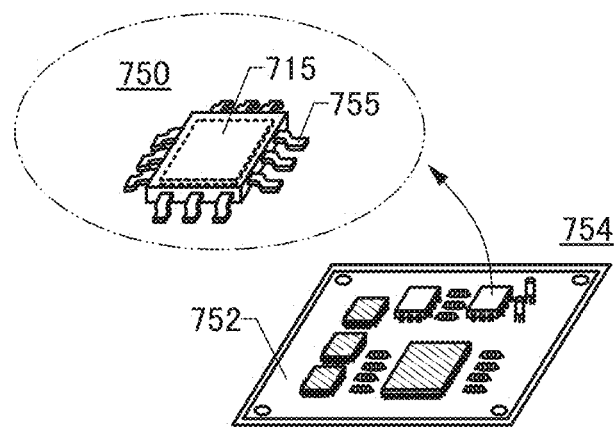
FIG. 18B is a schematic perspective view of the electronic component.

FIG. 18B is a perspective schematic diagram of a completed electronic component. FIG. 18B is a perspective schematic diagram illustrating a quad flat package (QFP) as an example of the electronic component. An electronic component 750 in FIG. 18B includes a lead 755 and the chip 715. The electronic component 750 may include more than one chip 715.

The electronic component 750 in FIG. 18B is mounted on a printed circuit board 752, for example. A plurality of electronic components 750 are combined and electrically connected to each other over the printed circuit board 752; thus, a circuit board on which the electronic components are mounted (a circuit board 754) is completed. The completed circuit board 754 is provided in an electronic device or the like.

The structures, methods, and the like described in this embodiment can be used in appropriate combination with any of the structures, methods, and the like described in the other embodiments.

Embodiment 4

<Electronic Devices>

A semiconductor device of one embodiment of the present invention can be used for a variety of electronic devices. FIGS. 19A to 19F illustrate specific examples of electronic devices including the semiconductor device of one embodiment of the present invention.

Figure 19A:
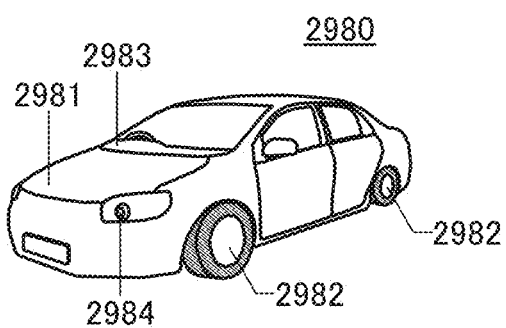
FIGS. 19A to 19F illustrate electronic devices of embodiments of the present invention.

FIG. 19A is an external view illustrating an example of a car. A car 2980 includes a car body 2981, wheels 2982, a dashboard 2983, lights 2984, and the like. The car 2980 also includes an antenna, a battery, and the like.

Figure 19B:
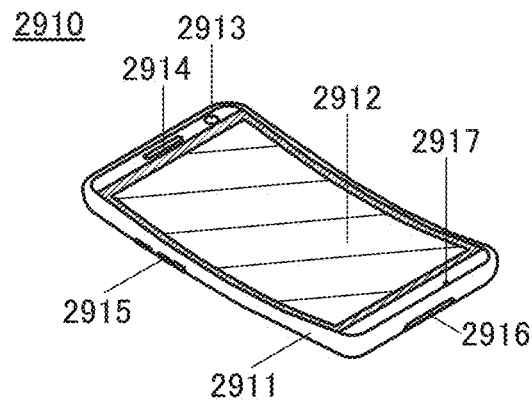

An information terminal 2910 illustrated in FIG. 19B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912.

In the housing 2911 of the information terminal 2910, an antenna, a battery, and the like are provided. The information terminal 2910 can be used as, for example, a smartphone, a mobile phone, a tablet information terminal, a tablet personal computer, or an e-book reader.

Figure 19C:
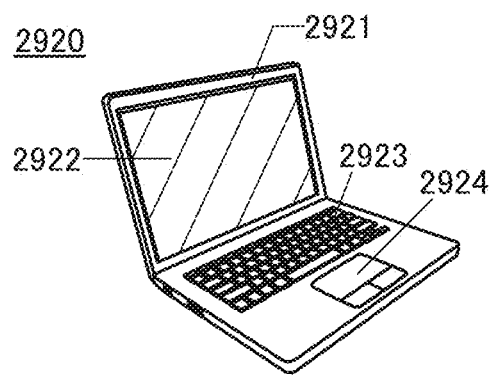

A notebook personal computer 2920 illustrated in FIG. 19C includes a housing 2921, a display portion 2922, a keyboard 2923, a pointing device 2924, and the like. In the housing 2921 of the notebook personal computer 2920, an antenna, a battery, and the like are provided.

Figure 19D:
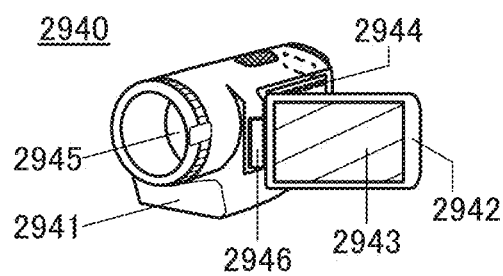

A video camera 2940 illustrated in FIG. 19D includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. In the housing 2941 of the video camera 2940, an antenna, a battery, and the like are provided. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image can be switched depending on the angle between the housings 2941 and 2942.

Figure 19E:
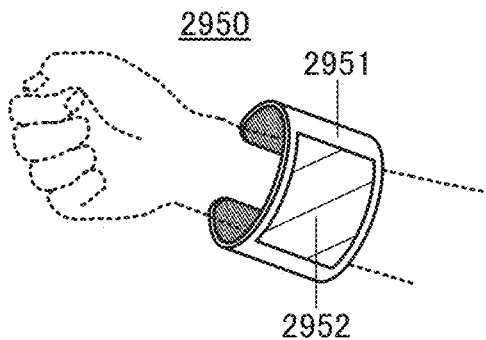

FIG. 19E illustrates an example of a bangle-type information terminal. An information terminal 2950 includes a housing 2951, a display portion 2952, and the like. In the housing 2951 of the information terminal 2950, an antenna, a battery, and the like are provided. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 19F:
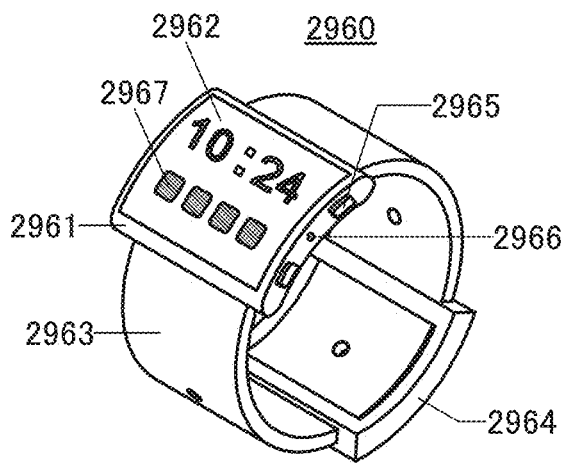

FIG. 19F illustrates an example of a watch-type information terminal. An information terminal 2960 includes a housing 2961, a display portion 2962, a band 2963, a buckle 2964, an operation switch 2965, an input output terminal 2966, and the like. In the housing 2961 of the information terminal 2960, an antenna, a battery, and the like are provided. The information terminal 2960 is capable of executing a variety of applications such as mobile phone calls, e-mailing, viewing and editing texts, music reproduction, Internet communication, and a computer game.

The display surface of the display portion 2962 is curved, and images can be displayed on the curved display surface. In addition, the display portion 2962 includes a touch sensor, and operation can be performed by touching the screen with a finger, a stylus, or the like. For example, by touching an icon 2967 displayed on the display portion 2962, application can be started. With the operation switch 2965, a variety of functions such as time setting, power on/off, on/off of wireless communication, setting and cancellation of a silent mode, and setting and cancellation of a power saving mode can be performed. For example, the functions of the operation switch 2965 can be set by setting the operation system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input output terminal 2966, and data can be directly transmitted to and received from another information terminal via a connector. In addition, charging via the input output terminal 2966 is possible. Note that the charging operation may be performed by wireless power feeding without using the input output terminal 2966.

A memory device including the semiconductor device of one embodiment of the present invention can hold control data, a control program, or the like of the above electronic device for a long time. With the use of the semiconductor device of one embodiment of the present invention, a highly reliable electronic device can be provided.

This embodiment can be implemented in an appropriate combination with any of the structures described in the other embodiments and the like.

This application is based on Japanese Patent Application Serial No. 2016-220496 filed with Japan Patent Office on Nov. 11, 2016, the entire contents of which are hereby incorporated by reference.

What is claimed is:

1. A semiconductor device comprising:
a first transistor;
an insulator covering the first transistor; and
a second transistor over the insulator,
wherein the first transistor includes:
 a first gate electrode;
 a second gate electrode overlapping with the first gate electrode; and
 a semiconductor between the first gate electrode and the second gate electrode,
wherein the first gate electrode is electrically connected to one of a source and a drain of the second transistor and a third gate electrode of the second transistor,
wherein on-state current of the first transistor is larger than on-state current of the second transistor, and
wherein a drain current of the second transistor when a gate voltage applied to the second transistor is 0 V is smaller than a drain current of the first transistor when a gate voltage applied to the first transistor is 0 V.

2. The semiconductor device according to claim 1,
wherein the semiconductor is a first semiconductor,
wherein the second transistor includes:
 a second semiconductor; and
 a first electrode and a second electrode electrically connected to the second semiconductor, and
wherein the first gate electrode and the one of the source and the drain of the second transistor are electrically connected to each other through one of the first electrode and the second electrode.

3. The semiconductor device according to claim 1,
wherein the semiconductor is located over the first gate electrode, and
wherein the second gate electrode is located over the semiconductor.

4. The semiconductor device according to claim 1,
wherein the second transistor includes a second semiconductor below the third gate electrode.

5. The semiconductor device according to claim 1,
wherein carrier mobility of the first transistor is higher than carrier mobility of the second transistor.

6. A semiconductor device comprising:
a first transistor;
an insulator covering the first transistor; and
a second transistor and a capacitor over the insulator,
wherein the first transistor includes:
 a first gate electrode;
 a second gate electrode overlapping with the first gate electrode; and
 a semiconductor between the first gate electrode and the second gate electrode, wherein the first gate electrode is electrically connected to one of a source and a drain of the second transistor and a third gate electrode of the second transistor, wherein on-state current of the first transistor is larger than on-state current of the second transistor, and wherein a drain current of the second transistor when a gate voltage applied to the second transistor is 0 V is smaller than a drain current of the first transistor when a gate voltage applied to the first transistor is 0 V.

7. The semiconductor device according to claim 6, wherein the semiconductor is a first semiconductor, wherein the second transistor includes:
    a second semiconductor; and
    a first electrode and a second electrode electrically connected to the second semiconductor, and
wherein the first gate electrode and the one of the source and the drain of the second transistor are electrically connected to each other through one of the first electrode and the second electrode.

8. The semiconductor device according to claim 6, wherein the semiconductor is located over the first gate electrode, and
wherein the second gate electrode is located over the semiconductor.

9. The semiconductor device according to claim 6, wherein the second transistor includes a second semiconductor below the third gate electrode.

10. The semiconductor device according to claim 6, wherein carrier mobility of the first transistor is higher than carrier mobility of the second transistor.

11. The semiconductor device according to claim 6, wherein the capacitor includes:
    a third electrode;
    a second insulator over the third electrode; and
    a fourth electrode over the second insulator, and
wherein the third electrode is electrically connected to one of a source and a drain of the first transistor.

12. The semiconductor device according to claim 6, wherein the capacitor includes:
    a third electrode formed with a same material as a source electrode and a drain electrode of the second transistor;
    a second insulator over the third electrode, the second insulator formed with a same material as a gate insulating film of the second transistor; and
    a fourth electrode over the second insulator, the fourth electrode formed with a same material as the third gate electrode.

\* \* \* \* \*